US010873001B2

(12) United States Patent
Jain et al.

(10) Patent No.: US 10,873,001 B2
(45) Date of Patent: Dec. 22, 2020

(54) METHODS OF MANUFACTURING OPTOELECTRONIC DEVICES USING DIFFERENT GROWTH SUBSTRATES

(71) Applicant: ALTA DEVICES, INC., Sunnyvale, CA (US)

(72) Inventors: Nikhil Jain, Sunnyvale, CA (US); Andrew J. Ritenour, San Jose, CA (US); Ileana Rau, Cupertino, CA (US); Claudio Canizares, Morgan Hill, CA (US); Lori D. Washington, Union City, CA (US); Gang He, Cupertino, CA (US); Brendan M. Kayes, Los Gatos, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 16/657,802

(22) Filed: Oct. 18, 2019

(65) Prior Publication Data

US 2020/0119222 A1    Apr. 16, 2020

Related U.S. Application Data

(63) Continuation-in-part of application No. 16/008,919, filed on Jun. 14, 2018.
(Continued)

(51) Int. Cl.
*H01L 21/00* (2006.01)
*H01L 31/18* (2006.01)

(52) U.S. Cl.
CPC .............................. *H01L 31/1892* (2013.01)

(58) Field of Classification Search
CPC .. H01L 31/1892; H01L 31/0735; Y02E 10/50
See application file for complete search history.

(56) References Cited

U.S. PATENT DOCUMENTS

2011/0186115 A1    8/2011  Wanlass et al.
2013/0133730 A1    5/2013  Pan et al.
(Continued)

OTHER PUBLICATIONS

International Search Report and Written Opinion corresponding to International Application No. PCT/US2018/037759, dated Nov. 30, 2018.
(Continued)

*Primary Examiner* — Laura M Menz
(74) *Attorney, Agent, or Firm* — Arent Fox LLP

(57) ABSTRACT

A growth structure having a lattice transition (or graded buffer) or an engineered growth structure with a desired lattice constant, different from a lattice constant of conventional substrates like GaAs, Si, Ge, InP, under a release layer or an etch stop layer is used as a seed crystal for growing optoelectronic devices. The optoelectronic device can be a photovoltaic device having one or more subcells (e.g., lattice-matched or lattice-mismatched subcells). The release layer can be removed using different processes to separate the optoelectronic device from the growth structure, which may be reused, or from the engineered growth structure. When using the etch stop layer, the growth structure or the engineered growth structure may be grinded or etched away. The engineered growth structure may be made from a layer transfer process between two wafers or from a ternary and/or a quaternary material. Methods for making the optoelectronic device are also described.

25 Claims, 29 Drawing Sheets

Related U.S. Application Data

(60) Provisional application No. 62/521,241, filed on Jun. 16, 2017.

(56) References Cited

U.S. PATENT DOCUMENTS

| | | | | |
|---|---|---|---|---|
| 2018/0366609 | A1* | 12/2018 | Ritenour | H01L 31/1892 |
| 2019/0259608 | A1* | 8/2019 | Kim | H01L 21/02444 |
| 2019/0386169 | A1* | 12/2019 | Jain | H01L 31/206 |
| 2019/0386170 | A1* | 12/2019 | Jain | H01L 31/1892 |
| 2020/0119216 | A1* | 4/2020 | Jain | H01L 31/02366 |
| 2020/0119222 | A1* | 4/2020 | Jain | H01L 31/06875 |

OTHER PUBLICATIONS

Kongjaeng, et al, "Structural investigation of InGaAsN films grown on pseudo-lattice-matched InGaAs substrates by metalorganic vapor phase epitaxy," Journal of Crystal Growth, vol. 298, 2007, pp. 111-115.

Zahler, et al, "High efficiency InGaAs solar cells on Si by InP layer transfer," Applied Physics Letters, vol. 91, 2007, pp. 12108-1 to 12108-3.

Partial International Search Report (PCT/ISA/206) dated Sep. 3, 2018 issued in corresponding International Application No. PCT/US2018/037759.

\* cited by examiner

METHODS OF MANUFACTURING OPTOELECTRONIC DEVICES USING DIFFERENT GROWTH SUBSTRATES

CROSS REFERENCE TO RELATED APPLICATIONS

The present application is a Continuation-In-Part of U.S. Non-Provisional application Ser. No. 16/008,919 entitled "Growth Structure Under a Release Layer for Manufacturing of Optoelectronic Devices," filed on Jun. 14, 2018, which claims priority to and the benefit of U.S. Provisional Application No. 62/521,241 entitled "Growth Substrate Under a Release Layer For Manufacturing of Optoelectronic Devices," filed on Jun. 16, 2017, both of which are incorporated herein by reference in their entirety. The present application is also related to concurrently filed U.S. Non-Provisional application Ser. No. 16/657,765 entitled "Optoelectronic Devices Manufactured Using Different Growth Substrates" filed on Oct. 18, 2019.

BACKGROUND OF THE DISCLOSURE

Aspects of the present disclosure generally relates to semiconductor substrates used in the manufacturing of optoelectronic devices, and more specifically, to certain growth structures having a semiconductor wafer or substrate, where the growth structures provide a specific lattice constant as the basis for growing an optoelectronic device.

The bandgaps of semiconductors that can be grown on commercially available substrates or wafers (e.g., GaAs and InP) are not ideal for certain types of optoelectronic devices, including but not limited to photovoltaic devices (e.g., solar cells) and light-emitting devices (LEDs). This is due to the restriction that only certain bandgaps may be obtained for a given lattice parameter under the constraint of lattice-matching (ensures minimal dislocation for high material quality), where the bandgaps are representative of the regions of the light spectrum that can be captured or generated. For example, lattice constants of commercially available wafers used to manufacture multi-junction photovoltaic devices (e.g., solar cells) may restrict the selection of bandgaps within the solar cell to values which are not ideal (e.g., result in low performance devices). Consequently, the attainable efficiency may be less than what is thermodynamically possible. The conventional way to grow materials with the near-ideal bandgaps on substrates with mismatched lattice constants has been to use graded buffer layers to change the lattice constant inside the epitaxial layer or stack. The mismatch in lattice constant between the seed substrate and the epitaxial layer grown on that substrate is addressed by using a graded buffer layer that is grown as part of the epitaxial layer or stack. Graded buffer layers are slow and costly to grow, add weight and thickness to the finished device, complicate processing, and is therefore preferable to use a different approach in which such layers are not part of the epitaxial stack.

Accordingly, techniques that enable manufacturing of optoelectronic devices without graded buffer layers within the optoelectronic device to address mismatch with the substrate are desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

As described above, the present disclosure generally relates to semiconductor substrates used in the manufacturing of optoelectronic devices, and more specifically, to certain growth structures having a semiconductor wafer or substrate, where the growth structures provide a specific lattice constant under a release layer or an etch stop layer, and where the growth structure is subsequently separated from an optoelectronic device grown over the release layer or the etch stop layer and having a lattice constant that matches that of the growth structure.

In an aspect of the present disclosure, an optoelectronic device is described that includes an epitaxial layer having multiple, stacked subcells that are lattice matched, where each subcell is configured to capture a different portion of a spectrum of light incident on the optoelectronic device, where each subcell includes at least one pn junction, where a lattice constant of the subcells does not match a lattice constant of a growth wafer on which the epitaxial layer was formed, and where the epitaxial layer is configured for further processing in which one or more additional layers are added to the optoelectronic device. Prior to the addition of the other layers the optoelectronic device may be referred to as being an intermediate product, for example.

In another aspect of the present disclosure, a method of manufacturing an optoelectronic device is described that includes providing a growth structure having a substrate and a lattice transition from a first lattice constant to a second lattice constant having a relaxed lattice constant. The second lattice constant of the lattice transition could have a large lattice constant overshoot layer to help attain relaxation. The method further includes depositing an epitaxial layer over the growth structure, where the epitaxial layer includes one or more subcells that form the optoelectronic device, where each subcell includes at least one pn junction, and where the subcells are lattice matched to the second lattice constant of the growth structure. Moreover, the method includes separating the epitaxial layer with the optoelectronic device from the growth structure. A release layer may be deposited over the growth structure with the epitaxial layer deposited over the release layer. In such a case, separating the epitaxial layer from the growth structure includes removing the release layer by one of an epitaxial lift-off (ELO) process or a laser lift-off (LLO) process or spalling or employing graphene as a release layer. Additionally or alternatively, an etch stop layer may be deposited over the growth structure, with the epitaxial layer deposited over the etch stop layer. In such a case, separating the epitaxial layer from the growth structure includes removing at least a portion of the growth structure through one or more of etching, polishing, grinding, or spalling, where such removal is limited by the etch stop layer.

In another aspect of the present disclosure, a different method of manufacturing an optoelectronic device is described that includes providing an engineered growth structure (also referred to as an engineered virtual growth substrate or an engineered bulk substrate) having a substrate and a relaxed lattice constant, where the engineered growth structure is made from a layer transfer process between two wafers of disparate materials or from a ternary material (e.g., InGaAs, InGaP, GaAsP or GaAsSb) and/or a quaternary material (e.g., AlInGaAs) that provides the desired relaxed lattice constant. The method further includes depositing a release layer or an etch stop layer on the engineered growth structure, and then depositing an epitaxial layer on the release layer or the etch stop layer, where the epitaxial layer includes one or more subcells that form the optoelectronic device, where each subcell includes at least one pn junction, and where the subcells are lattice matched to the relaxed lattice constant of the engineered growth structure. If the release layer is deposited, then the method includes removing the release layer to separate the epitaxial layer with the optoelectronic device from the engineered growth structure. On the other hand, if the etch stop is deposited, then the method includes grinding or etching away the engineered growth structure to separate the epitaxial layer with the optoelectronic device from the engineered growth structure.

In another aspect of the present disclosure, a lattice transition (or lattice transition layer), such as a graded buffer layer, for example, with lattice constant that transitions from that of the growth structure (approximately 5.653 Angstroms (Å) for GaAs, for example) to approximately 5.72 Å is incorporated into a growth structure rather than into an optoelectronic device (e.g., epitaxial stack of a photovoltaic device or solar cell). The growth structure is a layered structure that includes a single-crystal wafer or substrate. The wafer or substrate can be made of a semiconductor, an insulator/oxide (e.g., $La_2O_3$, NaCl), or a combination thereof. In this example, the growth structure can provide the lattice constant of 5.72 Å to enable growth of an all lattice-matched optoelectronic device which contains no graded buffer layers but that includes one or more subcells with near-ideal bandgaps. The lattice-matched optoelectronic device can later be detached from the growth structure or substrate using different types of processing, including different types of lift-off processes such as ELO process and LLO process, or other processes such as spalling or exfoliation or employing graphene as a release layer. The lift-off process is used to detach the optoelectronic device leaving the substrate, and the growth structure, intact so that they may be reused. In this manner, the time and cost involved in creating the lattice transition in the growth structure can be shared over multiple uses.

In another aspect of the present disclosure, a method of manufacturing an optoelectronic device is described that includes providing a growth structure having a semiconductor substrate or wafer and a lattice transition from a first lattice constant to a second lattice constant, depositing a release or sacrificial layer on the growth structure, depositing an epitaxial layer or stack on the release layer, the optoelectronic device and having a lattice constant that matches the second lattice constant of the growth structure, and removing the release layer to separate the epitaxial layer with the optoelectronic device from the growth structure (e.g., by an ELO process, LLO process, or by other processes such as grinding, etching, polishing, spalling, or exfoliating or employing graphene as a release layer).

In yet another aspect of the present disclosure, a method of making a growth structure for manufacturing an optoelectronic device is described that includes depositing a lattice transition layer over a semiconductor wafer (or semiconductor substrate), where the lattice transition layer has a transition from a first lattice constant near the semiconductor wafer to a second lattice constant (e.g., a relaxed lattice constant) away from the semiconductor wafer, depositing a buffer layer over the lattice transition layer, depositing a release layer over the buffer layer, and providing the semiconductor wafer with the lattice transition layer, the buffer layer, and the release layer to manufacture the optoelectronic device over the release layer (e.g., as part of an ELO process), where the optoelectronic device has a lattice constant that matches the second lattice constant. Near and beneath the second lattice constant of the lattice transition layer may be an overshoot layer to achieve the relaxation. In some instances, the lattice transition layer may be simply referred to as a lattice transition in or within the growth structure.

In another aspect of the present disclosure, the growth structure may be an engineered growth structure (also referred to as an engineered virtual growth substrate) that is configured to provide the appropriate lattice constant. For example, a method of manufacturing an optoelectronic device is described that includes providing an engineered growth structure (e.g., an engineered substrate or engineered growth structure) having a desired lattice constant, where the engineered growth structure is made from a layer transfer process between two wafers of disparate materials (e.g., by wafer bonding) or from a ternary material (e.g., InGaAs, InGaP, GaAsP or GaAsSb) and/or quaternary material (e.g., AlInGaAs) that produces the lattice constant, depositing a release or sacrificial layer on the engineered growth structure, depositing an epitaxial layer or stack on the release layer, where the epitaxial layer includes the optoelectronic device and having a lattice constant that matches the lattice constant of the engineered growth structure, and removing the release layer to separate the epitaxial layer with the optoelectronic device from the engineered growth structure (e.g., by any one of different processes, including an ELO process).

In another aspect of the present disclosure, a growth structure, including an engineered growth structure, may be used to grow an optoelectronic device having an epitaxial layer with multiple, stacked subcells that are lattice mismatched, where each subcell is configured to capture a different portion of a spectrum of light incident on the optoelectronic device, where each subcell includes at least one pn junction, and where a lattice constant of each of the subcells does not match a lattice constant of the growth structure on which the epitaxial layer was formed.

In yet another aspect of the present disclosure, a metamorphic layer is grown on a GaAs wafer to form a semiconductor structure so that the final lattice constant of the growth structure is 5.72 Å. As part of a process to manufacture an optoelectronic device (e.g., a photovoltaic device such as a solar cell), first a lattice-matched (Al)InGaAs or InGaP graded buffer layers are deposited as part of the growth structure (e.g., on a semiconductor substrate or wafer), followed by a release layer of (In)AlAs deposited on the buffer layer. Next a lattice-matched single or multi-junction optoelectronic device is deposited on the release layer as part of an epitaxial layer or stack. For example, a triple junction solar cell that includes one of (Al)InGaAs, InGaP, (Al)InGaAsP, and AlIn(Ga)P subcells is deposited. Next, the optoelectronic device is separated from the growth structure using any one of a number of processes, including an ELO process. The growth structure with the metamorphic layer can then be processed (e.g., cleaned and/or polished) to be re-used to manufacture additional optoelectronic devices.

The techniques described herein may be applicable to lattice match different subcell materials deposited on an engineered substrate with lattice constants greater than lattice constant of GaP (i.e., lattice constants greater than 5.45 Å), and more commonly to lattice constants greater than a lattice constant of GaAs and up to a lattice constant of InP (5.87 Å).

The techniques described herein may be applicable to optoelectronic devices grown in either an upright or inverted configuration. That is, these techniques may be used to grow the optoelectronic device sunny side up (e.g., the subcell to face incident light during operation is grown last and on top of other subcells) or to grow the optoelectronic device sunny side down (e.g., the subcell to face incident light during operation is grown first and at the bottom of the other subcells).

Moreover, the techniques described herein may be used to produce optoelectronic devices that when grown or deposited on the various growth structures described herein could be such that each optoelectronic device is all internally lattice-matched (e.g., three (3) individual subcells of a solar cell grown on growth structure could all be lattice-matched), is all internally lattice-mismatched with metamorphic graded buffers in between them, or is partially internally lattice-matched or partially internally lattice-mismatched.

BRIEF DESCRIPTION OF THE DRAWINGS

The appended drawings illustrate only some implementation and are therefore not to be considered limiting of scope.

DETAILED DESCRIPTION

Figure 1A:
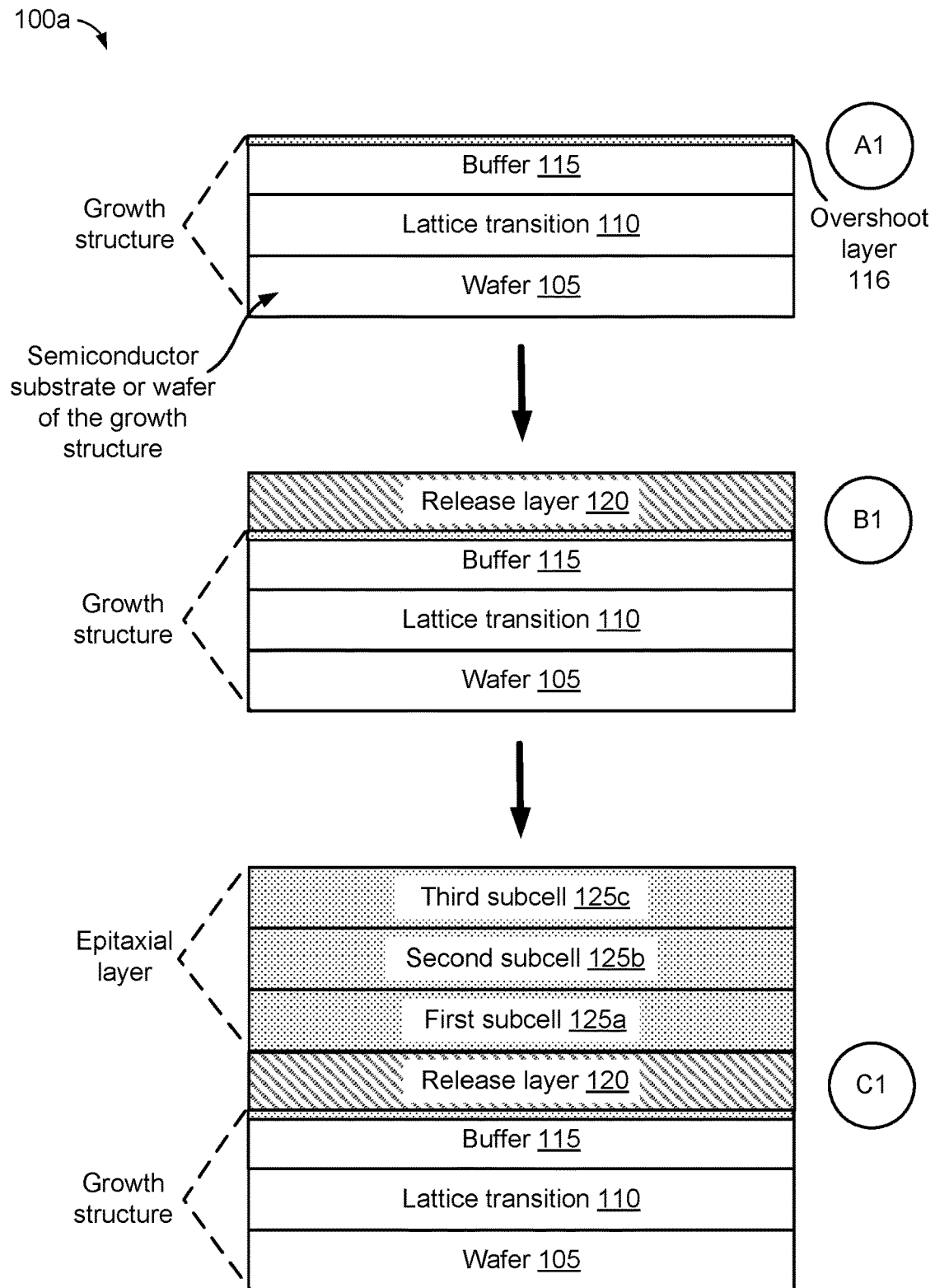
FIGS. 1A and 1B are diagrams that illustrate an example of a process to manufacture an optoelectronic device using a growth structure with a lattice transition and a release layer in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, lattice mismatch between the wafer and the epitaxial layer or stack is one issue that arises when using commercially available substrates or wafers. This is generally the case with commercial substrates or wafers made from single or two-atom crystals such as Si, Ge, InP, and GaAs wafers. These are generally referred to as conventional wafers, and can also include other types of wafers such as GaN and sapphire/quartz. For example, the lattice constant of a GaAs wafer is about 5.65 Å and the lattice constant of a Ge wafer is about 5.66 Å, but the epitaxial layer or stack of an optoelectronic device may require a lattice constant of 5.72 Å or even 5.74 Å. To address this issue, one or more graded buffer layers are typically incorporated into the epitaxial layer or stack as part of the growth process to change the lattice constant inside the epitaxial layer. This approach makes the manufacturing process slow and costly, and tends to add weight and thickness to the finished device. In other words, the adjustment in the lattice constant is entirely done within the epitaxial layer, thereby increasing the time it takes to deposit the epitaxial layer, its thickness, weight, and cost.

In this disclosure, a lattice transition or lattice transition layer, that provides a lattice constant larger than that of the substrate on which it is disposed (e.g., a lattice constant larger than that of conventional wafers), is incorporated into a growth structure instead of being incorporated within the optoelectronic device (as would be more typical, for example, in an inverted metamorphic (IMM) design). This approach allows for one or more subcells to be grown as part of the epitaxial layer having near-ideal bandgaps, that is, the desired bandgaps are achieved while enabling lattice matching within the epitaxial layer without the need for graded buffer layers in the active epitaxial device layers. It is to be understood that similar techniques to those described herein may be used in applications where a lattice transition or lattice transition layer provides a lattice constant smaller than that of the substrate on which it is disposed. Accordingly, the techniques described herein may be applicable to lattice match different subcell materials to lattice constants greater than a lattice constant of GaP, and more commonly to lattice constants greater than a lattice constant of GaAs and up to a lattice constant of InP. In addition, when one or more subcells in the epitaxial layer are to have lattice constant mismatch, the use of graded buffer layers in the epitaxial layer is merely to make a lattice constant adjustment between adjacent subcells and not to make a lattice constant adjustment between the subcells and the substrate or wafer used to grow the epitaxial layer.

This disclosure describes different optoelectronic devices, epitaxial layers used in such devices, and methods of making both. These devices and/or layers can be made using conventional substrates or wafers with layers that enable variable lattice constants or using unconventional substrates or wafers. The optoelectronics devices and/or epitaxial layers can have a thickness of less than 15 microns to provide sufficient flexibility. Moreover, the optoelectronic devices can have reflectors or reflecting layers added to improve their performance.

FIG. 1A shows diagram 100a that illustrates part of a process to manufacture an optoelectronic device using a growth structure with a lattice transition and a release layer. The process involves a Step A1, which shows a growth structure having a semiconductor substrate or wafer 105, a lattice transition 110 disposed over the wafer 105, and a (optional) buffer 115 disposed over the lattice transition 110. The buffer 115 may include an overshoot layer 116, also referred to as a strain balance layer. When the buffer 115 is not used, the overshoot layer 116 may be included in the lattice transition 110. Moreover, the buffer 115 may be part of the lattice transition 110. The lattice transition 110 can also be referred to as a lattice transition layer. In some examples, the lattice transition 110 is epitaxially grown (e.g., deposited) over the wafer 105. The lattice transition 110 is configured to transition from a first lattice constant associated with the wafer 105 to a second lattice constant (e.g., a relaxed lattice constant) associated with the buffer 115. The overshoot layer 116 may be placed in the buffer 115 just beneath the second lattice constant to achieve relaxation.

Although various examples described herein are based on the use of a semiconductor substrate or wafer, such as the wafer 105 described above, the disclosure need not be so limited. Single-crystal wafers or substrates, whether they are made of a semiconductor and/or an insulator/oxide (e.g., $La_2O_3$, NaCl), can also be used in the same manner as the wafer 105 and similar wafers described herein. The wafer 105 may typically be a conventional wafer having a lattice constant that is too small (or too large) to match the lattice constant of a device or structure to be grown on the wafer 105. For example, the wafer 105 may be a conventional wafer (e.g., commercially available wafers) such as Si, Ge, GaAs, InP, GaN, or sapphire/quartz wafers.

Step B1, which follows Step A1, shows a release layer 120 disposed over the growth structure, and more specifically over the buffer 115. The release layer 120 can also be referred to as a sacrificial layer because it is generally removed during a lift-off process (e.g., an ELO process or a LLO process) or some other removal process. The release layer 120 may contain or include an aluminum-containing compound such as AlAs, AlGaAs, AlInP, or InAlAs, which is susceptible to etching by hydrofluoric acid (HF). When HF is applied as part of the ELO process, the release layer 120 is etched away in order to separate the epitaxial layer from the growth structure while the other layers of the structure are unaffected by the HF (e.g., they are resistant to the HF). The release layer 120 (and similar release layers described below) can be made of graphene, for example, which may also be removed during a lift-off process (e.g., ELO or LLO) or by spalling. In an aspect, the lattice constant of the release layer 120 can have a range based on the material composition. In one example, the lattice constant of the release layer 120 can be between 5.65 Å and 5.80 Å. The lattice constant of the release layer 120 can be made to substantially match the second lattice constant (the relaxed lattice constant) associated with the lattice transition 110 or the buffer 115.

In Step C1, which follows Step B1, one or more subcells can be disposed over the release layer 120 to form part of an epitaxial layer or epitaxial stack. For example, a first subcell 125a can be disposed over the release layer 120 by, for example, epitaxially growing the first subcell 125a. Optionally, a second subcell 125b can be disposed over the first subcell 125a by, for example, epitaxially growing the second subcell 125b. Also optionally, a third subcell 125c can be disposed over the second subcell 125b by, for example, epitaxially growing the third subcell 125c.

Although the example shown in FIG. 1A includes up to three (3) subcells, it is to be understood that the application is not so limited and that the number of subcells can vary depending on the type of optoelectronic device being manufactured. For example, for a single-junction (1J) photovoltaic device, the first subcell 125a can be sufficient to produce the 1J photovoltaic device, where the structure of the first subcell 125a provides for the single junction. Similarly, for a dual-junction (2J) photovoltaic device, the first subcell 125a and the second subcell 125b can be sufficient to produce the 2J photovoltaic device, where the structure of the first subcell 125a provides for the first junction and the structure of the second subcell 125b provides for the second junction. The same goes for a triple-junction (3J) photovoltaic device, where the first subcell 125a, the second subcell 125b, and the third subcell 125c can be sufficient to produce the 3J photovoltaic device, and where the structure of the first subcell 125a provides for the first junction, the structure of the second subcell 125b provides for the second junction, and the structure of the third subcell 125c provides for the third junction. It is to be understood that these examples of 1J, 2J, and 3J photovoltaic devices can be expanded to photovoltaic devices of four or more junctions by disposing additional subcells as part of the epitaxial layer. Moreover, the photovoltaic devices having 1J, 2J, 3J or more junctions can be solar cells, and the photovoltaic devices having 1J can be light-emitting devices, for example.

The first subcell 125a, the second subcell 125b, and the third subcell 125c can have matching lattice constants. For example, each of these subcells can have a lattice constant of between 5.66 Å and 5.89 Å. In some cases, one or more of the subcells can have lattice constants below that of GaAs, for example, below 5.65-5.66 Å and as low as the lattice constant for GaP of about 5.45 Å.

Figure 1B:
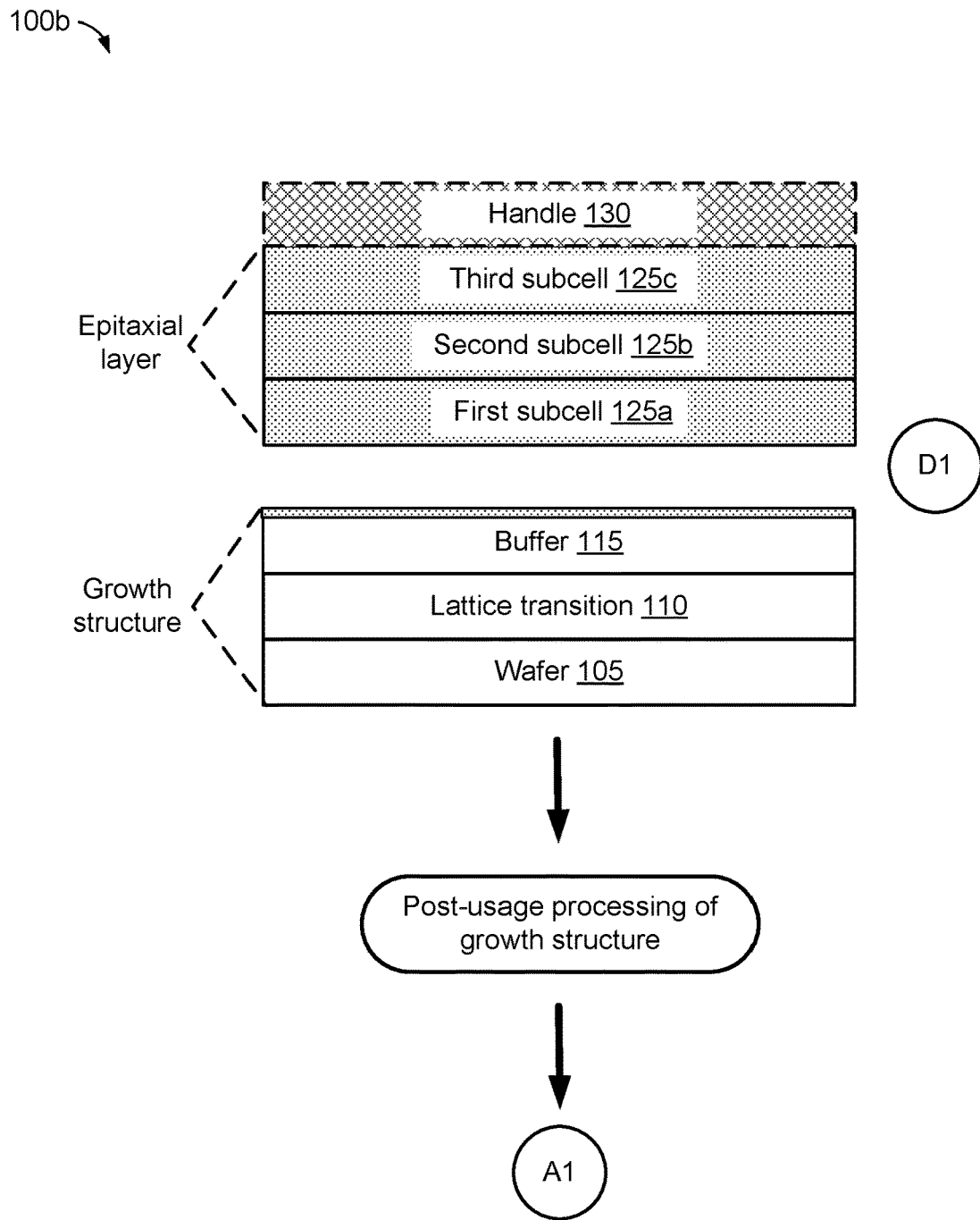

FIG. 1B shows diagram 100b that illustrates a remaining part of the process to manufacture an optoelectronic device using a growth structure with a lattice transition and a release layer described in the diagram 100a in FIG. 1A. In Step D1, which follows Step C1 shown in FIG. 1A, a handle 130 (e.g., an ELO handle for ELO-related operations) is attached to the top subcell (e.g., the third subcell 125c when such a subcell is grown). The handle 130 can be attached using different techniques and/or materials (e.g., different types of adhesives). The handle 130 is used to transport the epitaxial layer after the removal of the release layer 120 by any one of different processes of techniques (e.g., by an etching or similar operation that is part of the ELO process). Upon removal of the release layer 120, the epitaxial layer having the optoelectronic device (e.g., the one or more subcells) is separated from the growth structure having the lattice transition 110 as well as the buffer 115 and the wafer 105. The growth structure can then be cleaned and/or polished to be reused in Step A1 to grow additional optoelectronic devices. This cleaning and/or polishing process may involve redepositing at least part of the buffer 115 and/or the overshoot layer 116, for example.

As shown in FIGS. 1A and 1B, because the lattice transition occurs within the growth structure and not within the epitaxial layer or the electronic device, the time to grow such lattice transition is no longer part of the process to manufacture the optoelectronic device since it takes place before when the growth structure is being constructed. The cost of growing such a lattice transition within the growth structure is now shared with all the optoelectronic devices made from that same growth structure. Moreover, the weight and thickness associated with the lattice transition are now borne by the growth structure and not by the optoelectronic device (e.g., the epitaxial layer or stack).

It is to be understood that the various layers, subcells, or structures illustrated as part of the epitaxial layer and the growth structure in FIGS. 1A and 1B are not drawn to scale and are not intended to indicate a relative thickness with respect to each other. Instead, they are provided with sufficient thickness for labeling and to make it easy to identify their order or positioning. Moreover, FIGS. 1A and 1B are not intended to illustrate the varying lattice constants in the growth structure and/or the epitaxial layer.

Figure 1C:
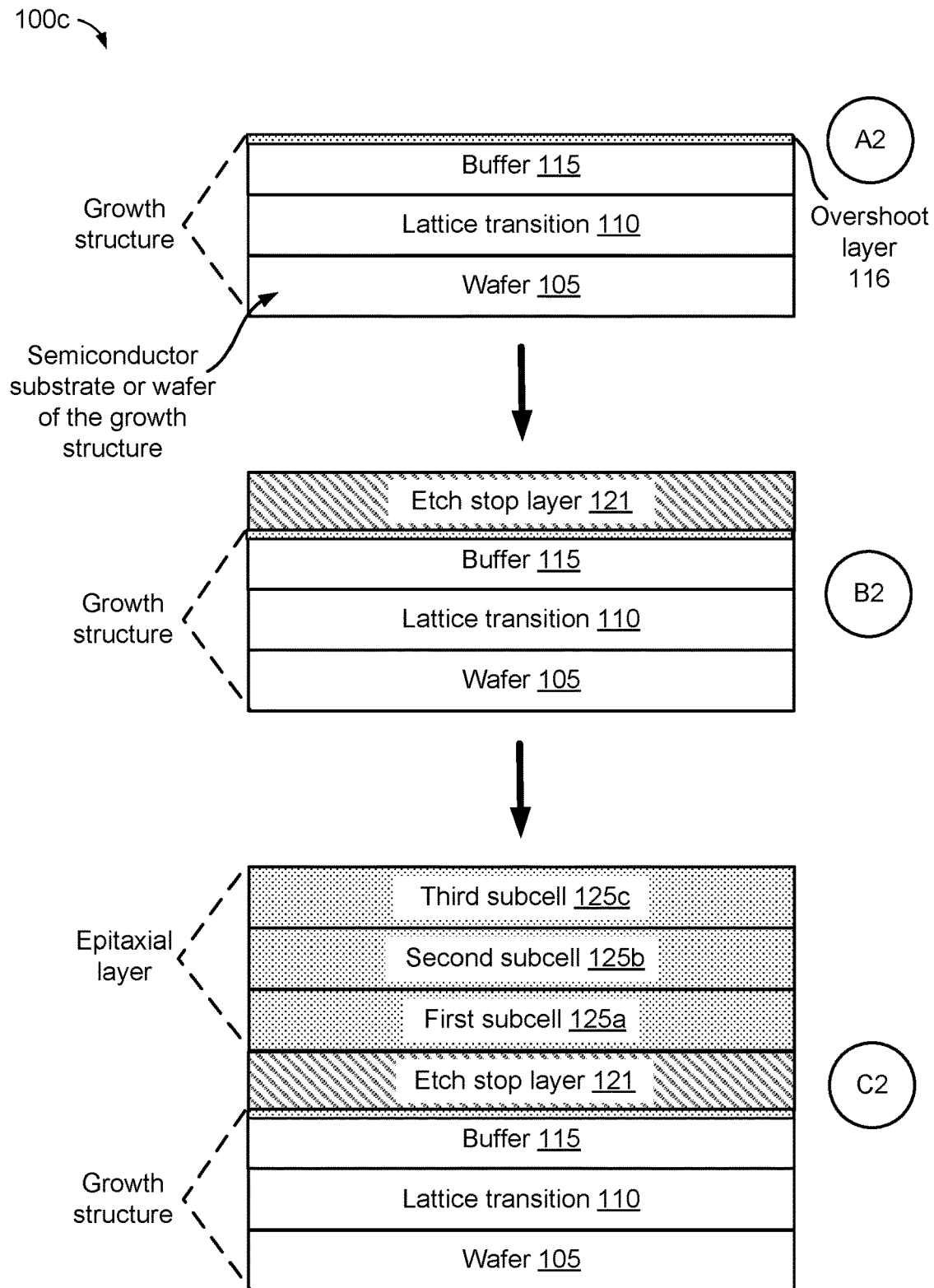
FIGS. 1C and 1D are diagrams that illustrate an example of a process to manufacture an optoelectronic device using a growth structure with a lattice transition and an etch stop layer in accordance with aspects of this disclosure.

FIG. 1C shows diagram 100c that illustrates part of a process to manufacture an optoelectronic device using a growth structure with a lattice transition and an etch stop layer. Steps A2, B2, and C2 in the diagram 100c are very similar to corresponding Steps A1, B1, and C1 in the diagram 100a in FIG. 1A. The one difference is that rather than disposing a release layer 120 over the growth structure as in Step B1, and more specifically over the buffer 115, in Step B2 an etch stop layer 121 is disposed instead. The etch stop layer 121 can include materials such as InGaP or other similar Group III-V semiconductor materials and can be made of one single layer or multiple layers.

Figure 1D:
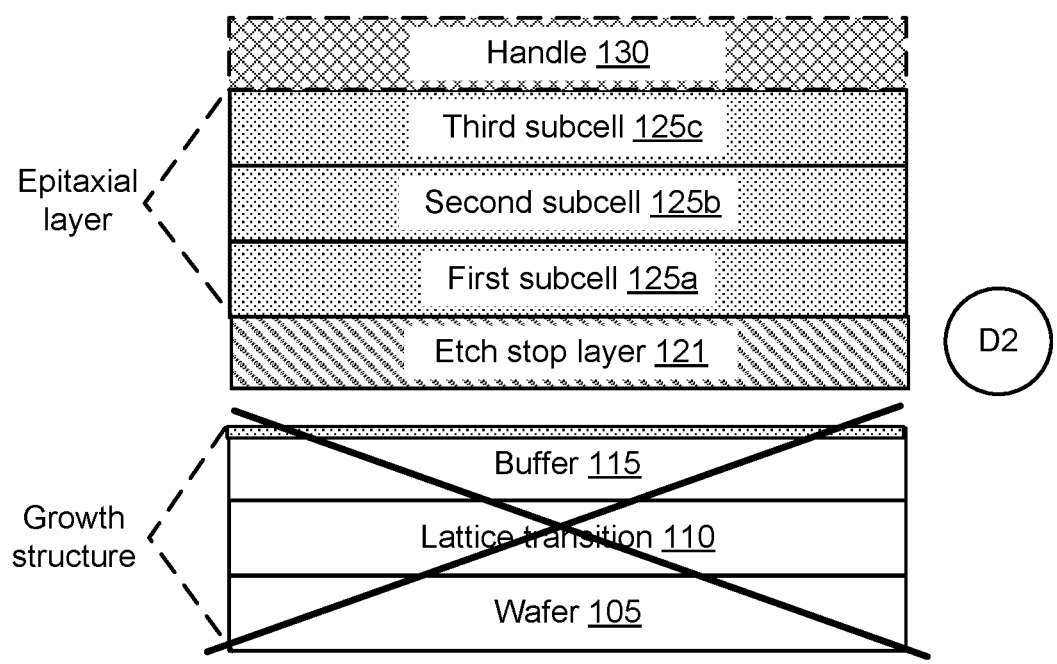

FIG. 1D shows diagram 100d that illustrates a remaining part of the process to manufacture an optoelectronic device using a growth structure with a lattice transition and an etch stop layer described in the diagram 100c in FIG. 1C. In this case, in Step D2, the growth structure, including the wafer 105, the lattice transition 110, and the buffer 115 (e.g., with the overshoot layer 116), may be removed by etching, grinding, exfoliating, spalling, and/or any other similar method or process. The presence of the etch stop layer 121 ensures that whichever method or process is used, the removal of the growth structure does not go beyond the etch stop layer 121, and therefore, does not affect the optoelectronic device formed by the epitaxial layer. The etch stop layer 121 may be made thin enough that it is kept as part of the epitaxial layer or may itself be removed by some other process different from the process used to remove the growth structure. Since the growth structure is clearly damaged as part of this process it may not be reused as is the case in FIG. 1B. While the cost of the growth structure may not be shared among multiple optoelectronic devices, the ability to have the weight and thickness associated with the lattice transition be borne by the growth structure still provides significant advantages.

It is to be understood that the various layers, subcells, or structures illustrated as part of the epitaxial layer and the growth structure in FIGS. 1C and 1D are not drawn to scale and are not intended to indicate a relative thickness with respect to each other. Instead, they are provided with sufficient thickness for labeling and to make it easy to identify their order or positioning. Moreover, FIGS. 1C and 1D are not intended to illustrate the varying lattice constants in the growth structure and/or the epitaxial layer.

The epitaxial layers constructed in the manner described in FIGS. 1A and 1B or in the manner described in FIGS. 1C and 1D are intended to have a small thickness. For example, these epitaxial layers having three subcells are intended to have a maximum thickness of 15 microns such that they are thin-enough to enable flexible optoelectronic devices such as flexible solar cells.

Figure 1E:
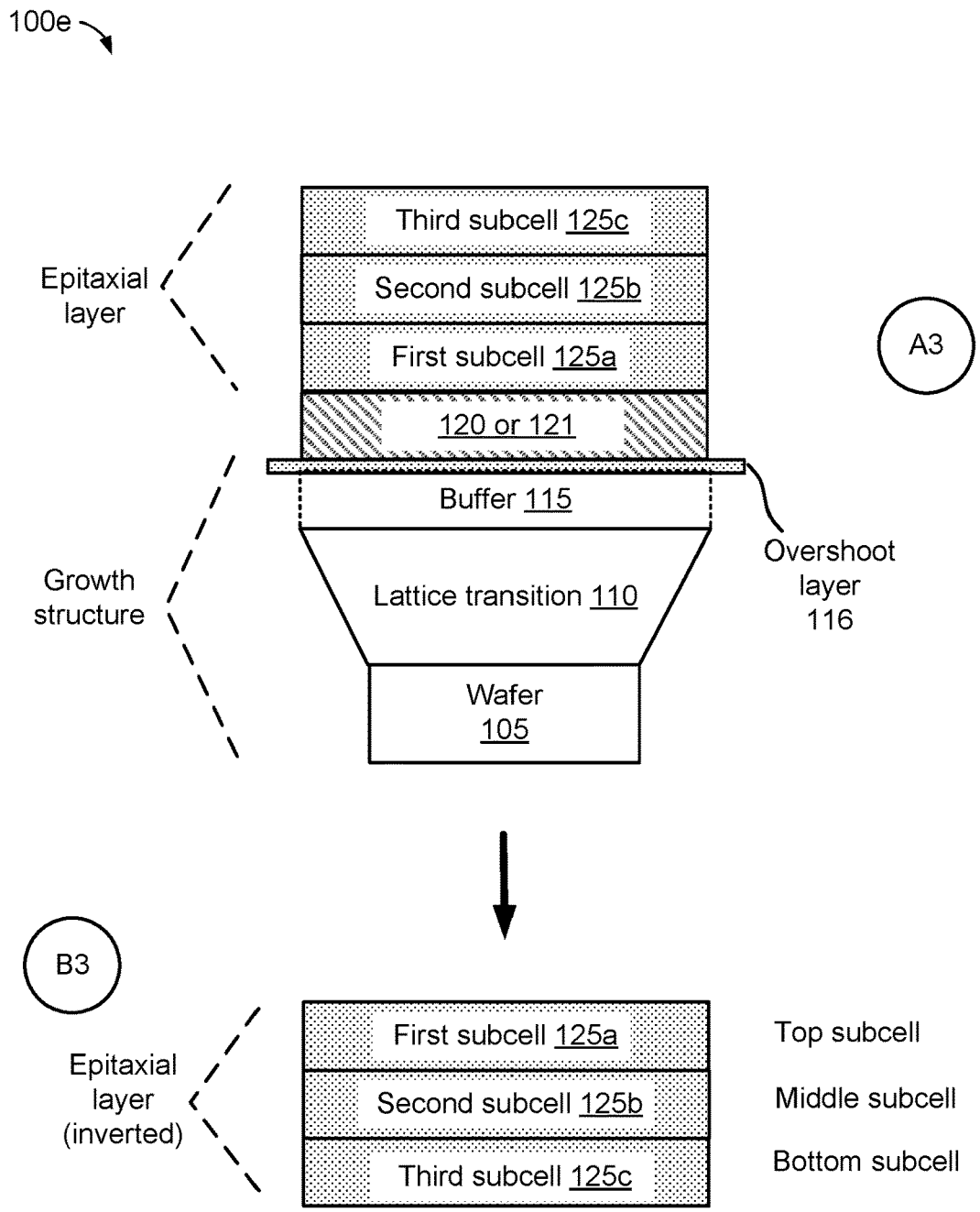
FIG. 1E is a diagram that illustrates an example of a process to manufacture an optoelectronic device with three lattice-matched subcells using a release layer or an etch stop layer in accordance with aspects of this disclosure.

FIG. 1E shows a diagram 100e that illustrates an example of a process to manufacture an optoelectronic device with three lattice-matched subcells using the release layer 120 or the etch stop layer 121. In the diagram 100e, the width of each layer is intended to illustrate or correspond to a lattice constant of that layer. For example, the wider a layer the larger the lattice constant of that layer compared to other layers.

The process involves a Step A3, which shows a growth structure having the semiconductor substrate or wafer 105, the lattice transition 110 disposed over the wafer 105, and optionally the buffer 115 disposed over the lattice transition 110 with the overshoot layer 116. As illustrated, the wafer 105 has a narrow width corresponding to a first lattice constant (e.g., GaAs wafer with a lattice constant of 5.65-5.66 Å), the lattice transition 110 has a varying width from the first lattice constant near the wafer 105 to a second lattice constant (larger than the first lattice constant). In some examples, the second lattice constant of the lattice transition 110 may be about 5.72 Å. The buffer layer 115 when used has a lattice constant similar to that of the second lattice constant of the lattice transition 110. The overshoot layer 116 has a lattice constant larger than that of the buffer 115 and the second lattice constant of the lattice transition 110 to provide some strain relaxation for the second lattice constant. The overshoot layer 116 typically has larger in lattice constant in comparison to the layers underneath and above it. This allows to attain relaxation in the buffer layer(s) 115 before growing the active layers (e.g., the epitaxial layers) of the optoelectronic device.

Also shown is the release layer 120 or the etch stop layer 121, either one having the same width (e.g., lattice constant) as the second lattice constant of the lattice transition 110 or the lattice constant of the buffer 115. On top of either of these layers, the epitaxial layer is grown with the first subcell 125a deposited first, the second subcell 125b deposited second, and the third subcell 125c deposited third (e.g., inverted structure). All three subcells in this example are lattice-matched (have the same width) to the second lattice constant of the lattice transition 110 or the lattice constant of the buffer 115. For example, each of the three subcells can have a lattice constant of about 5.72 Å.

At Step B3, which follows Step A3 (and some intermediate steps not shown), the epitaxial layer is separated or isolated from the growth structure by either etching or removing the release layer 120 or by etching, grinding, or removing the growth structure and the etch stop layer 121. As shown, the epitaxial layer has been inverted from its growth direction to show the first subcell 125a as the top subcell (during operation of the optoelectronic device), the second subcell 125b as the middle subcell, and the third subcell 125c as the bottom subcell. That is, in this example, the subcells are grown sunny side down and they are then inverted after being separated from the growth structure.

Figure 1F:
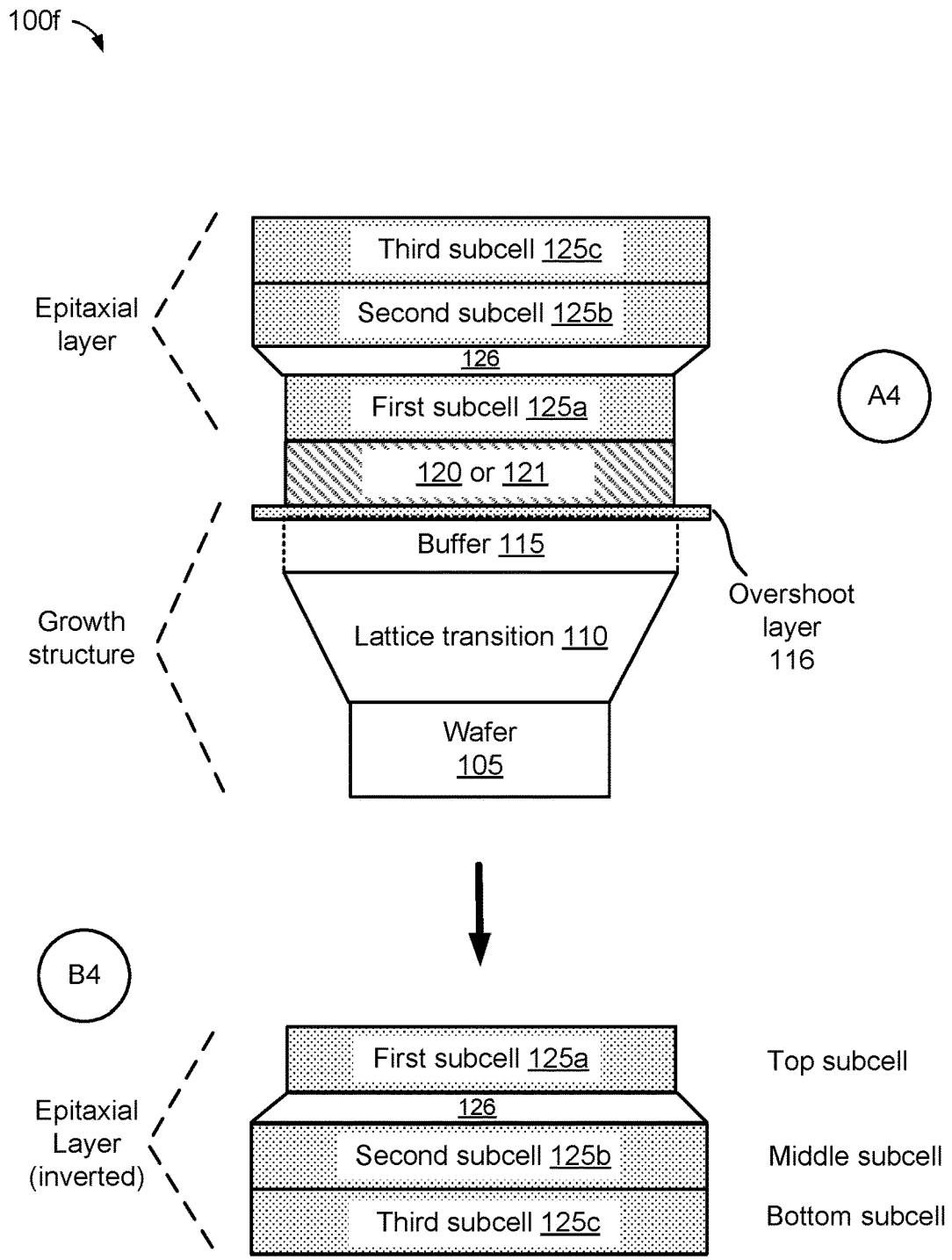
FIG. 1F is a diagram that illustrates an example of a process to manufacture an optoelectronic device with three subcells using a release layer or an etch stop layer two of which are lattice-matched in accordance with aspects of this disclosure.

FIG. 1F shows a diagram 100f that illustrates an example of a process to manufacture an optoelectronic device with three subcells using the release layer 120 or the etch stop layer 121 with two of the subcells being lattice-matched. In the diagram 100f, the width of each layer is intended to illustrate or correspond to a lattice constant of that layer.

The process involves a Step A4, which shows a growth structure having the semiconductor substrate or wafer 105, the lattice transition 110 disposed over the wafer 105, and optionally the buffer 115 disposed over the lattice transition 110 with the overshoot layer 116. As illustrated, the wafer 105 has a narrow width corresponding to a first lattice constant (e.g., GaAs wafer with a lattice constant of 5.65-5.66 Å), the lattice transition 110 has a varying width from the first lattice constant near the wafer 105 to a second lattice constant (larger than the first lattice constant). The buffer layer 115 when used has a lattice constant similar to that of the second lattice constant of the lattice transition 110. The overshoot layer 116 has a lattice constant larger than that of the buffer 115 and the second lattice constant of the lattice transition 110 to provide some strain relaxation for the second lattice constant. In some examples, the second lattice constant of the lattice transition 110 may be about 5.72 Å.

Also shown is the release layer 120 or the etch stop layer 121, either one having the same width (e.g., lattice constant) as the second lattice constant of the lattice transition 110 or the lattice constant of the buffer 115. On top of either of these layers, the epitaxial layer is grown with the first subcell 125a deposited first and having a similar lattice constant (width) as that of the buffer 115 or the second lattice constant of the lattice transition 110. For example, the first subcell 125a can have a lattice constant of about 5.72 Å. After the first subcell 125a, a graded buffer layer 126 is deposited to transition from the lattice constant of the first subcell 125a to a lattice constant of the second subcell 125b, which is greater than the lattice constant of the first subcell 125a. After the second subcell 125b is deposited, the third subcell 125c is deposited having a lattice constant that matches that of the second subcell 125b.

At Step B4, which follows Step A4 (and some intermediate steps not shown), the epitaxial layer is separated or isolated from the growth structure by either etching or removing the release layer 120 or by etching, grinding, or removing the growth structure and the etch stop layer 121. As shown, the epitaxial layer has been inverted from its growth direction to show the first subcell 125a as the top subcell (during operation of the optoelectronic device), the second subcell 125b as the middle subcell with the graded buffer layer 126 between the first subcell 125a and the second subcell 125b, and the third subcell 125c as the bottom subcell. That is, in this example, like the example in FIG. 1E, the subcells are grown sunny side down and they are then inverted after being separated from the growth structure.

Figure 1G:
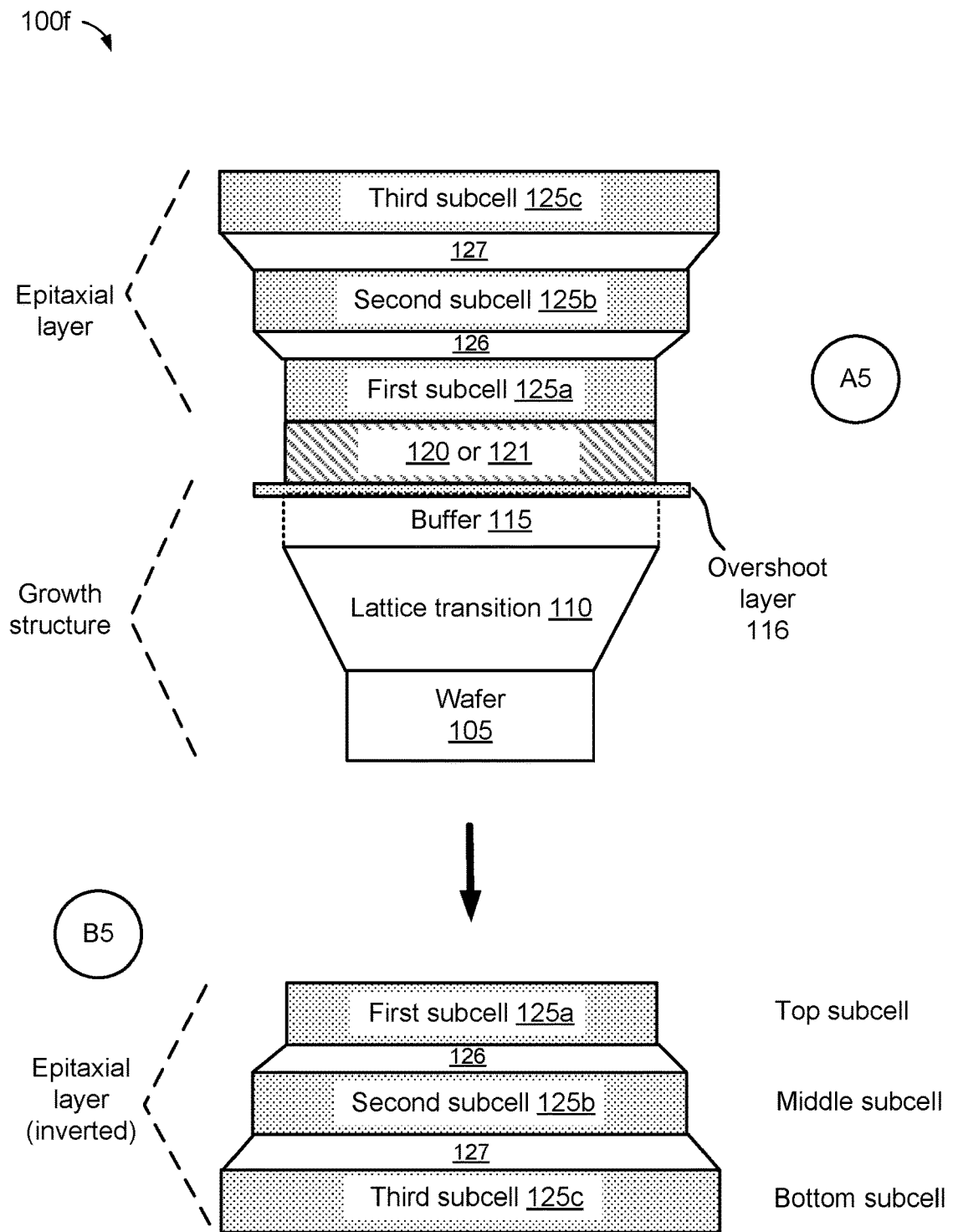
FIG. 1G is a diagram that illustrates an example of a process to manufacture an optoelectronic device with three subcells using a release layer or an etch stop layer all of which are lattice mismatched in accordance with aspects of this disclosure.

FIG. 1G shows a diagram 100g that illustrates an example of a process to manufacture an optoelectronic device with three subcells using the release layer 120 or the etch stop layer 121 with all of the subcells being lattice mismatched. In the diagram 100g, the width of each layer is intended to illustrate or correspond to a lattice constant of that layer.

The process involves a Step A5, which shows a growth structure having the semiconductor substrate or wafer 105, the lattice transition 110 disposed over the wafer 105, and optionally the buffer 115 disposed over the lattice transition 110 with the overshoot layer 116. As illustrated, the wafer 105 has a narrow width corresponding to a first lattice constant (e.g., GaAs wafer with a lattice constant of 5.65-5.66 Å), the lattice transition 110 has a varying width from the first lattice constant near the wafer 105 to a second lattice constant (larger than the first lattice constant). The buffer layer 115 when used has a lattice constant similar to that of the second lattice constant of the lattice transition 110. The overshoot layer 116 has a lattice constant larger than that of the buffer 115 and the second lattice constant of the lattice transition 110 to provide some strain relaxation for the second lattice constant. In some examples, the second lattice constant of the lattice transition 110 may be about 5.72 Å.

Also shown is the release layer 120 or the etch stop layer 121, either one having the same width (e.g., lattice constant) as the second lattice constant of the lattice transition 110 or the lattice constant of the buffer 115. On top of either of these layers, the epitaxial layer is grown with the first subcell 125a deposited first and having a similar lattice constant (width) as that of the buffer 115 or the second lattice constant of the lattice transition 110. For example, the first subcell 125a can have a lattice constant of about 5.72 Å. After the first subcell 125a, the graded buffer layer 126 is deposited to transition from the lattice constant of the first subcell 125a to a lattice constant of the second subcell 125b, which is greater than the lattice constant of the first subcell 125a. After the second subcell 125b is deposited, a graded buffer layer 127 is deposited to transition from the lattice constant of the second subcell 125b to a lattice constant of the third subcell 125c, which is greater than the lattice constant of the second subcell 125b.

At Step B5, which follows Step A5 (and some intermediate steps not shown), the epitaxial layer is separated or isolated from the growth structure by either etching or removing the release layer 120 or by etching, grinding, or removing the growth structure and the etch stop layer 121. As shown, the epitaxial layer has been inverted from its growth direction to show the first subcell 125a as the top subcell (during operation of the optoelectronic device), the second subcell 125b as the middle subcell with the graded buffer layer 126 between the first subcell 125a and the second subcell 125b, and the third subcell 125c as the bottom subcell with the graded buffer layer 127 between the second subcell 125b and the third subcell 125c. That is, in this example, like the examples in FIGS. 1E and 1F, the subcells are grown sunny side down and they are then inverted after being separated from the growth structure.

It is to be understood that the examples described in FIGS. 1E-1G can also be grown sunny side up, with the bottom-most subcell grown first and the top-most subcell grown last.

Moreover, the epitaxial layers constructed in the manner described in FIGS. 1E-1G are also intended to have a small thickness. For example, these epitaxial layers having three subcells (e.g., all lattice matched, all lattice mismatch, or partially lattice matched/mismatched) are intended to have a maximum thickness of 15 microns such that they are thin-enough to enable flexible optoelectronic devices such as flexible solar cells.

Figure 1H:
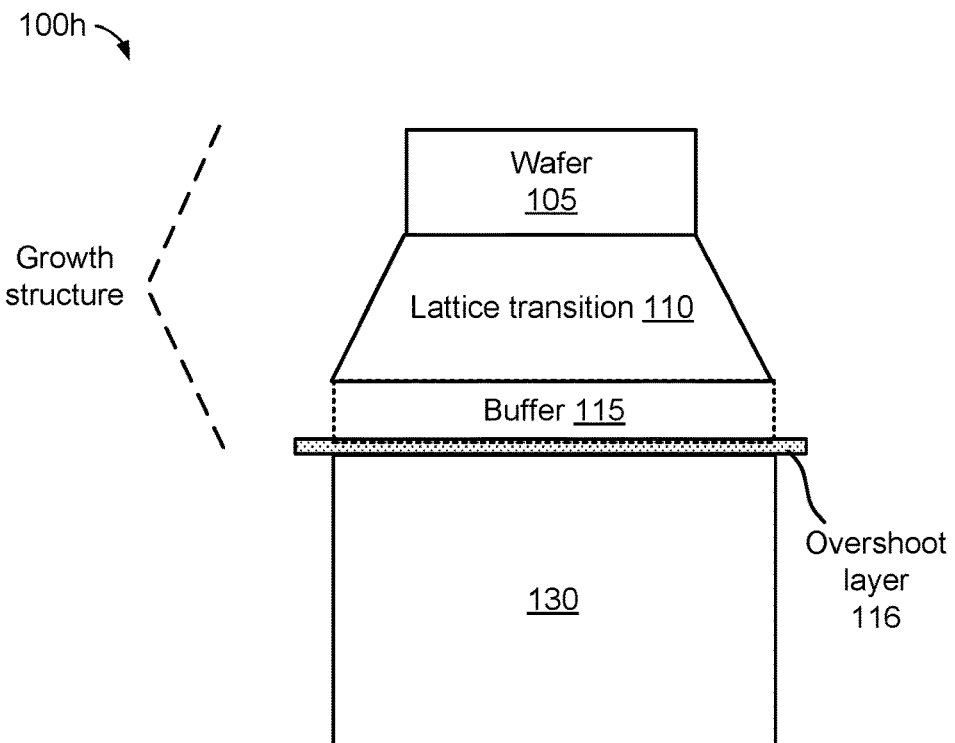
FIGS. 1H and 1I are diagrams that illustrate the use of an overshoot layer and an undershoot layer in accordance with aspects of this disclosure.
Figure 1I:
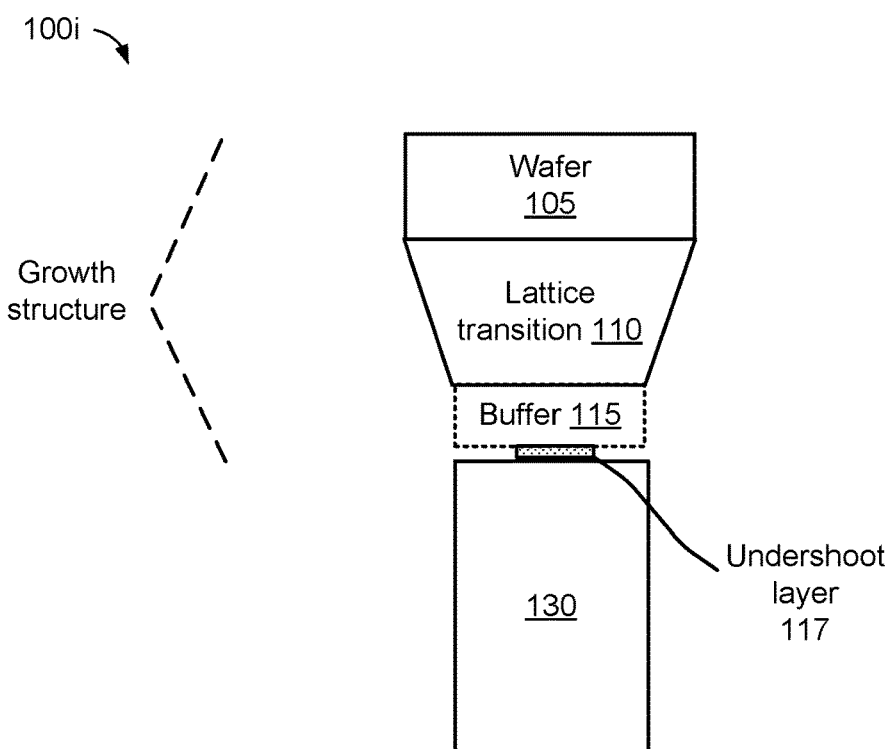

FIGS. 1H and 1I respectively show diagrams 100h and 100i that illustrate the use of an overshoot layer and an undershoot layer. The diagram 100h shows a growth structure at the top (inverted growth diagram) that includes the wafer 105, the lattice transition 110, optionally the buffer 115, and the overshoot layer 116. Like FIGS. 1E-1G above, the width of each layer is intended to illustrate or correspond to a lattice constant of that layer. In this case, the lattice transition 110 goes from a smaller lattice constant (e.g., that of the wafer 105) to a larger lattice constant to match a lattice constant of an epitaxial layer or stack 130 to be grown over the growth structure. The overshoot layer 116 is shown to have a larger lattice constant than that of the lattice transition 110 or the epitaxial layer 130.

In the diagram 100i, a growth structure is shown at the top (inverted growth diagram) that includes the wafer 105, the lattice transition 110, optionally the buffer 115, and an undershoot layer 117. Like FIGS. 1E-1G above, the width of each layer is intended to illustrate or correspond to a lattice constant of that layer. In this case, the lattice transition 110 goes from a larger lattice constant (e.g., that of the wafer 105) to a smaller lattice constant to match a lattice constant of an epitaxial layer or stack 130 to be grown over the growth structure. The undershoot layer 117 is shown to have a smaller lattice constant than that of the lattice transition 110 or the epitaxial layer 130.

The use of an undershoot layer 117 may be applicable to any of the techniques described herein when the growth structure is used to transition from a large lattice constant in a conventional wafer to a small lattice constant of one or more subcells in an optoelectronic device. For example, when matching to lattice constants that are greater or larger than that of GaAs, then an overshoot layer such as the overshoot layer 116 described above may be used. When matching to lattice constants that are smaller than that of GaAs, then an undershoot layer such as the undershoot layer 117 described above may be used.

Figure 2A:
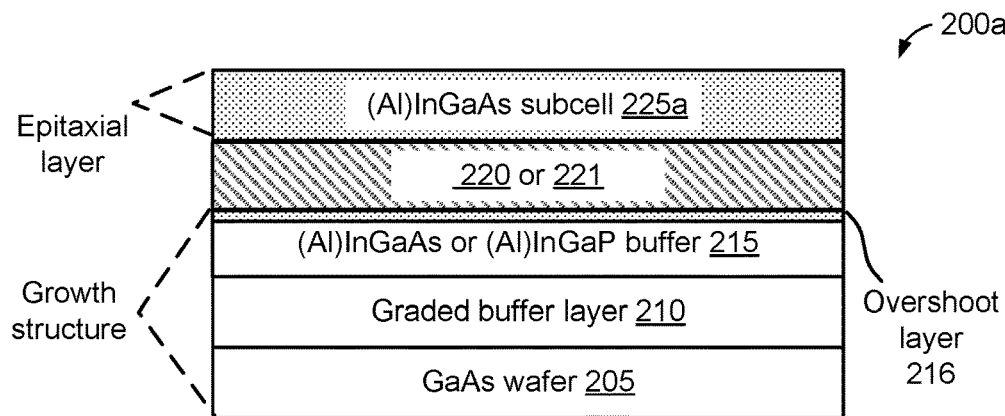
FIGS. 2A-2C are diagrams that illustrate examples of optoelectronic devices with a single junction (e.g., single subcell) or multiple subcells manufactured in accordance with aspects of this disclosure.

FIG. 2A shows a diagram 200a that illustrates an example of an optoelectronic device with a single subcell (or single junction) on a growth structure. In this example, the growth structure is similar to the ones shown in FIGS. 1A and 1C, and includes a GaAs wafer 205, a graded buffer layer 210 disposed over the GaAs wafer 205, and an (Al)InGaAs or (Al)InGaP buffer 215 with an overshoot layer 216. The graded buffer layer 210 corresponds to the lattice transition 110, examples of which are shown in FIGS. 1A and 1C. The graded buffer layer 210 can be a compositionally graded buffer that includes (Al)InGaAs or (Al)InGaP or SiGe, and can be configured to provide a variation or transition in lattice constant from a first lattice constant by the GaAs wafer 205 to a second lattice constant (e.g., a relaxed lattice constant) by the buffer 215. The compositionally graded buffer can be achieved by changing the stoichiometry of the (Al)InGaAs or the (Al)InGaP or the SiGe.

Also shown in FIG. 2A is either a release layer 220 or an etch stop layer 221 disposed over the growth structure and more specifically over the buffer 215. The release layer 220 corresponds to the release layer 120, an example of which is shown in FIG. 1A. The release layer 220 can be made of different aluminum-containing compounds including AlAs as well as AlGaAs, AlInP, or InAlAs. The etch stop layer 221 corresponds to the etch stop layer 121, and example of which is shown in FIG. 1C.

The epitaxial layer in this example, which corresponds to at least a portion of the optoelectronic device, includes a single subcell, which in this case is a first subcell 225a that is an (Al)InGaAs subcell. A material in parenthesis (e.g., (Al)) indicates that the overall composition can include that material or can exclude that material, both options are possible.

An example of a single subcell optoelectronic device can be a single-junction (1J) photovoltaic device (e.g., a single-junction solar cell or single junction LED). In such an example, the lattice constant for the GaAs wafer 205 can be 5.65 Å, the lattice constant for the graded buffer layer 210 can be graded or varied to go from 5.65 Å to 5.89 Å, the lattice constant for the buffer 215 can be 5.66 Å to 5.89 Å (for example, 5.67 Å), the lattice constant for the release layer 220 can range from 5.65 Å to 5.67 Å (or from 5.65 Å to 5.89 Å as well), and the lattice constant for the (Al)InGaAs subcell 225a can be 5.66 Å to 5.89 Å (for example, 5.72 Å).

Figure 2B:
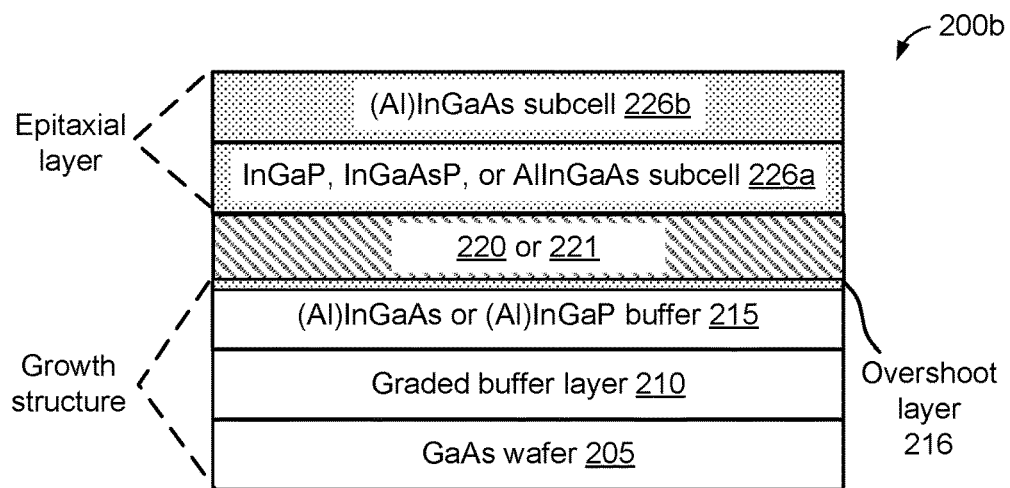

FIG. 2B shows a diagram 200b that illustrates an example of an optoelectronic device with two subcells (or dual-junction) on a growth structure. In this example, the growth structure is similar to the one shown in FIG. 2A. The release layer 220 or the etch stop layer 221 is again disposed over the growth structure and more specifically over the buffer 215. The epitaxial layer in this example, which corresponds to at least a portion of the optoelectronic device, includes two subcells, which in this case includes a first subcell 226a that is an InGaP, (Al)InGaAsP, or (Al)InGaAs subcell and a second subcell 226b that is an (Al)InGaAs subcell.

An example of a dual subcell optoelectronic device can be a dual-junction (2J) photovoltaic device (e.g., a dual-junction solar cell). In such an example, the lattice constant for the GaAs wafer 205 can be 5.65 Å, the lattice constant for the graded buffer layer 210 can be graded or varied to go from 5.65 Å to 5.74 Å, the lattice constant for the buffer 215 can be 5.72 Å to 5.74 Å, the lattice constant for the release layer 220 can range from 5.65 Å to 5.74 Å, and the lattice constant for each of the InGaP, (Al)InGaAsP, or (Al)InGaAs subcell 226a and the (Al)InGaAs subcell 226b can be 5.72 Å to 5.74 Å. The subcells may have bandgaps in the range of 1.8-1.6 eV for top-cell and 1.2-1.0 eV for bottom-cell. A desirable combination would be 1.7/1.1 eV at 5.72 Å lattice-constant.

Figure 2C:
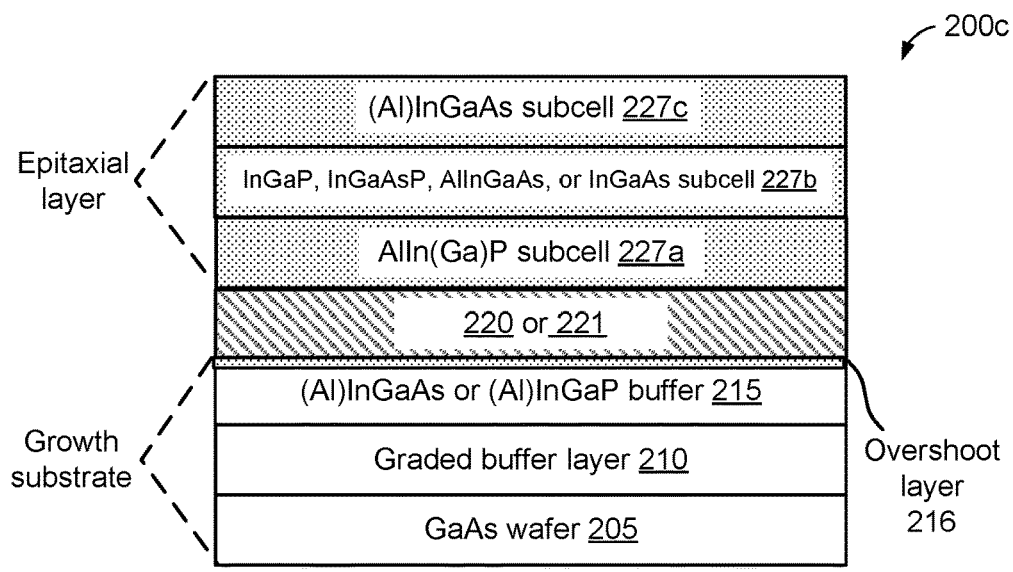

FIG. 2C shows a diagram 200c that illustrates an example of an optoelectronic device with three subcells (or triple-junction) on a growth structure. In this example, the growth structure is similar to the one shown in FIG. 2A. The release layer 220 or the etch stop layer 221 is again disposed over the growth structure and more specifically over the buffer 215. The epitaxial layer in this example, which corresponds to at least a portion of the optoelectronic device, includes three subcells, which in this case includes a first subcell 227a that is an AlInGaP or AlInP subcell, a second subcell 227b that is an (Al)InGaAsP or InGaP or (Al)InGaAs subcell, and a third subcell 227c that is an (Al)InGaAs subcell.

An example of a triple subcell optoelectronic device can be a triple-junction (3J) photovoltaic device (e.g., a triple-junction solar cell). In such an example, the lattice constant for the GaAs wafer 205 can be 5.65 Å, the lattice constant for the graded buffer layer 210 can be graded or varied to go from 5.65 Å to 5.80 Å, the lattice constant for the buffer 215 can be 5.78 Å to 5.89 Å, the lattice constant for the release layer 220 can range from 5.65 Å to 5.89 Å, and the lattice constant for each of the AlIn(Ga)P subcell 227a, the InGa(As)P or AlInGaAs or InGaAs subcell 227b, and the (Al)InGaAs subcell 227c can be in the range between 5.45 Å (GaP) to 6.06 Å (InAs), and more particularly in the range between 5.65 Å (GaAs) to 5.87 Å (InP). The bandgap of the top-cell can be in the range of ~2.2 to 1.7 eV, middle cell ~1.7 to 1.3 eV, bottom cell from ~1.3 to 0.9 eV. A desirable combination would be 1.9/1.37/0.93 eV at 5.77 Å.

In some instances, in the various examples described herein, a lattice constant of 5.74 Å may refer to a range of 5.72 Å to 5.75 Å, for example. In some instances, the lower value in the range, 5.72 Å, may be preferred. Similarly, other lattice constants used herein may correspond to a range with values that can range within +/−1%.

Moreover, it is to be understood that the optimal lattice constant provided by the growth structure in the various examples described herein may be a function of how many junctions or subcells are part of the epitaxial layer or epitaxial stack and the light spectrum for the intended application.

Figure 2D:
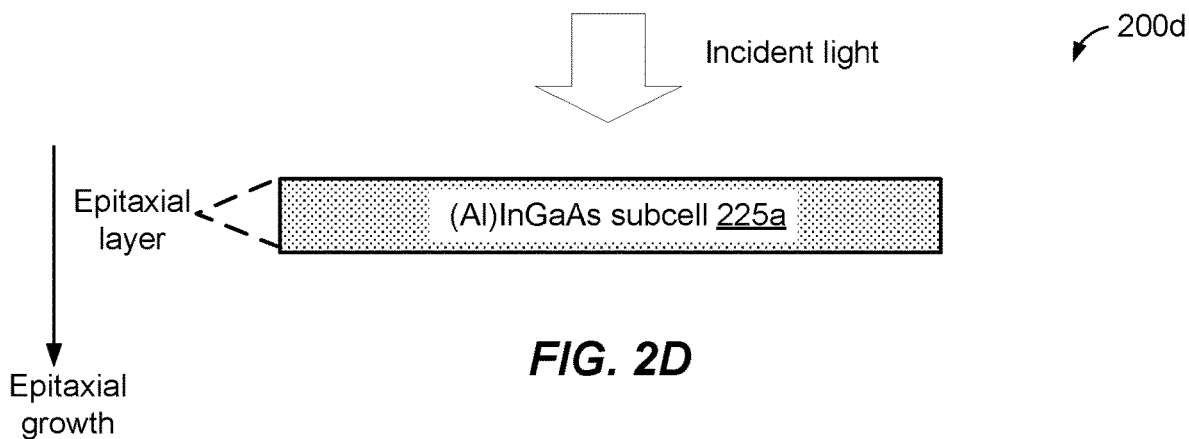
FIGS. 2D-2F are diagrams that illustrate examples of the optoelectronic devices in FIGS. 2A-2C oriented for operation in accordance with aspects of this disclosure.

FIG. 2D shows a diagram 200d in which the epitaxial layer from FIG. 2A is shown once it has been separated from the growth structure and reoriented according to the direction of use. In this case, one side (e.g., front side) of the single (Al)InGaAs subcell 225a that forms the optoelectronic device faces light incident on the optoelectronic device, and an opposite side (e.g., back or rear side) does not face the incident light.

Figure 2E:
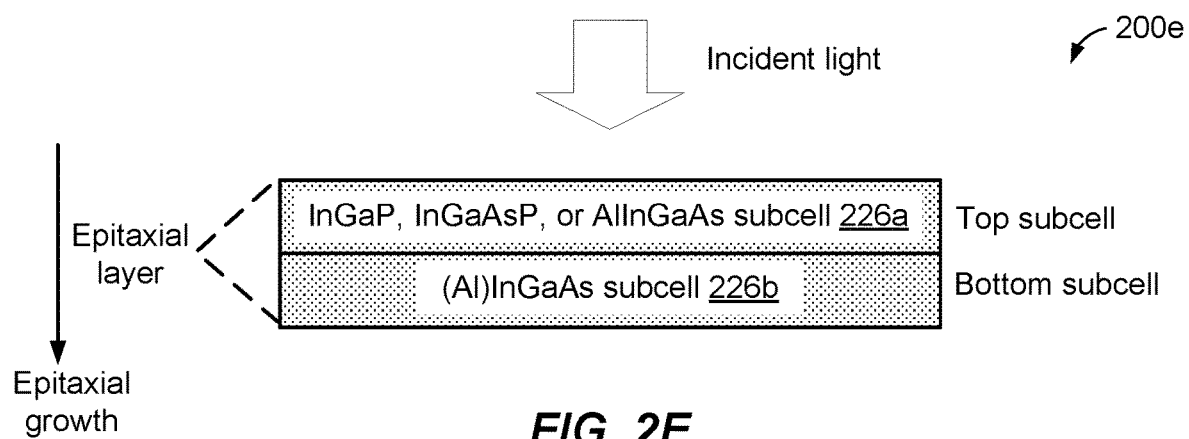

FIG. 2E shows a diagram 200e in which the epitaxial layer from FIG. 2B is shown once it has been separated from the growth structure and reoriented according to the direction of use. In this case, the InGaP, (Al)InGaAsP, or (Al)InGaAs subcell 226a is now a top subcell of the optoelectronic device and has one side (e.g., front side) facing light incident on the optoelectronic device, and an opposite side (e.g., back or rear side) does not face the incident light. The (Al)InGaAs subcell 226b is a bottom subcell of the optoelectronic device below the top subcell and also has one side (e.g., front side) facing the incident light and an opposite side not facing the incident light.

Figure 2F:
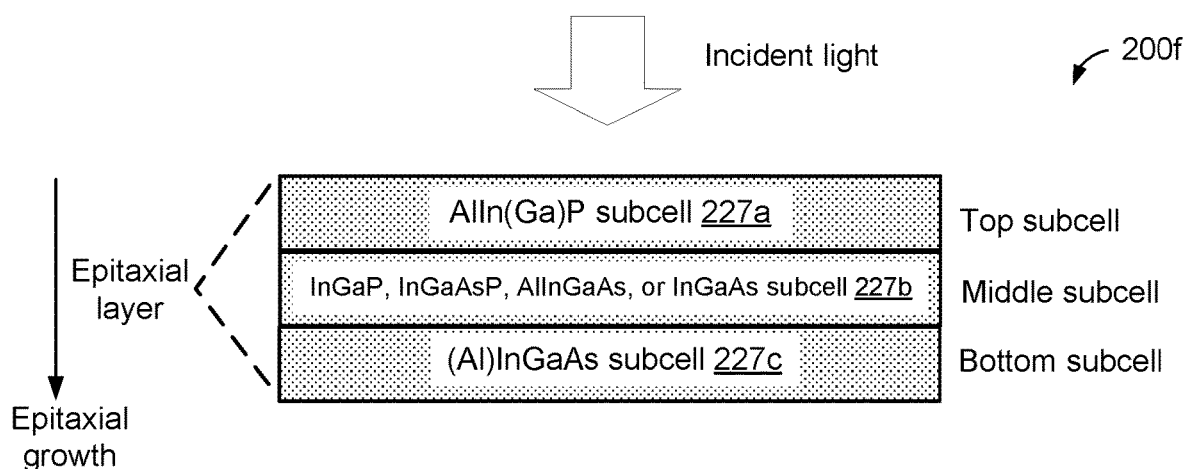

FIG. 2F shows a diagram 200f in which the epitaxial layer from FIG. 2C is shown once it has been separated from the growth structure and reoriented according to the direction of use. In this case, the AlIn(Ga)P subcell 227a is now a top subcell of the optoelectronic device and has one side (e.g., front side) facing light incident on the optoelectronic device, and an opposite side (e.g., back or rear side) does not face the incident light. The InGaP, InGaAsP, AlInGaAs, or InGaAs subcell 227b is a middle subcell of the optoelectronic device below the top subcell, and the (Al)InGaAs subcell 227c is a bottom subcell of the optoelectronic device below the middle subcell. The medium and bottom subcells each has one side (e.g., front side) facing the incident light and an opposite side that does not face the incident light.

Figure 3A:
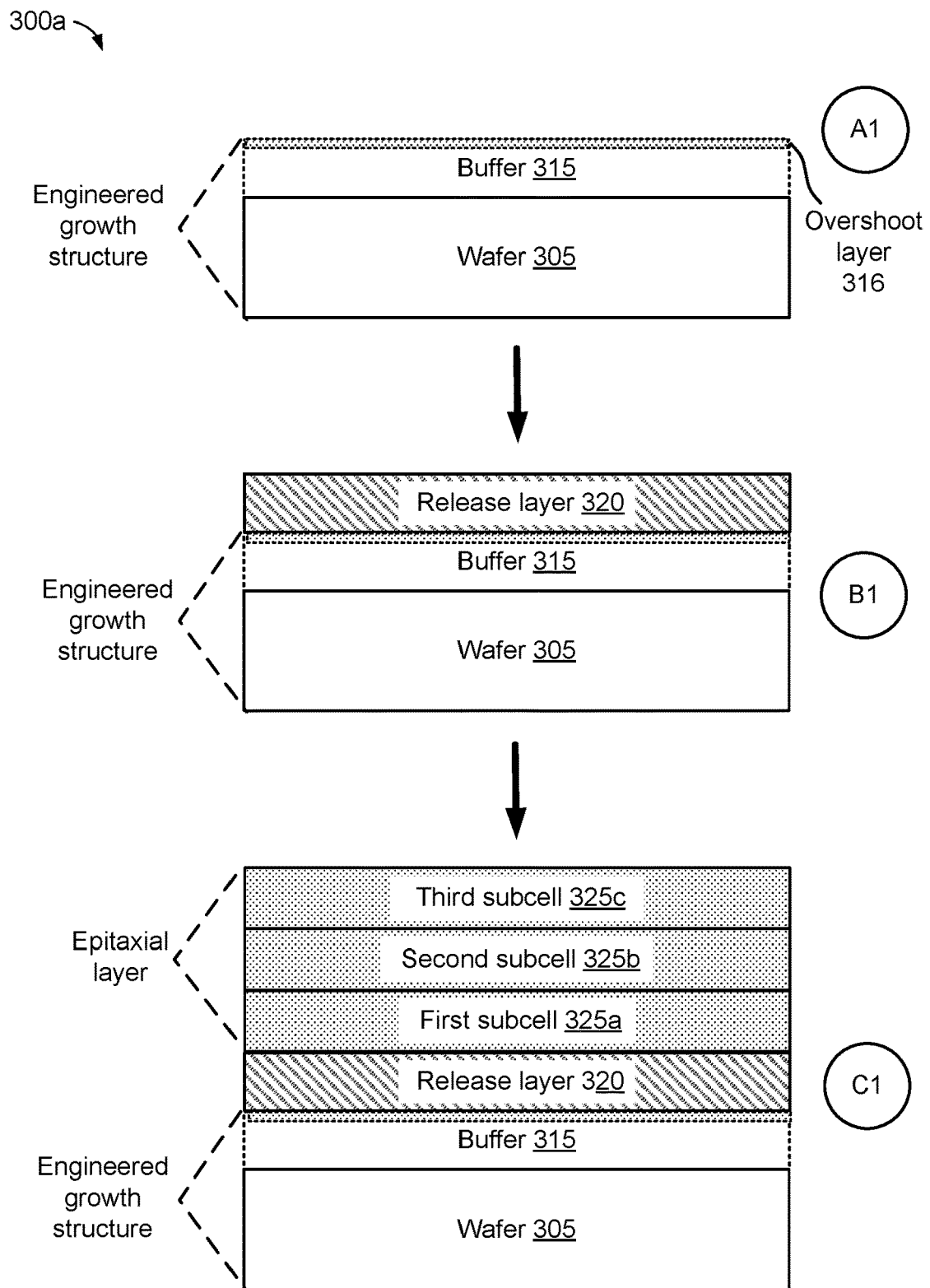
FIGS. 3A and 3B are diagrams that illustrate an example of a process to manufacture an optoelectronic device using an engineered growth structure (also referred to as an engineered virtual growth substrate) and a release layer in accordance with aspects of this disclosure.

FIG. 3A shows diagram 300a that illustrates part of a process to manufacture an optoelectronic device using an engineered growth structure (also referred to as an engineered virtual growth substrate) and a release layer. In this process, Step A1 shows an engineered growth structure having a semiconductor wafer 305 and optionally a buffer 315 disposed over the wafer 305. The buffer 315 may include an overshoot layer 316 as shown. The engineered growth structure can be made by a layer transfer process between two wafers of disparate materials or from a ternary material (e.g., InGaAs, InGaP, GaAsP or GaAsSb) and/or quaternary material (e.g., AlInGaAs) that produces the desired lattice constant instead of using a commercially available (e.g., conventional) single or two-atom materials (e.g., Si, Ge, GaAs, InP, GaN) wafer or sapphire/quartz. For example, two wafers of different lattice constants can be bonded to produce a specified lattice constant on a surface of the engineered growth structure. In another example, two wafers of different lattice constants can be bonded and a portion of the top wafer can be removed (e.g., by separating part of the top wafer at an ion-implant location) to produce a specified lattice constant on a surface of the engineered growth structure. Additionally, as mentioned above, a wafer can be made of a ternary and/or a quaternary material. Ternary materials may be made of any combination of three elements from In, Ga, Al, As, P, N, B, Bi, and Sb, for example. Quaternary materials may be made of any combination of four elements from In, Ga, Al, As, P, N, B, Bi, and Sb, for example In another aspect of FIG. 3A, the buffer 315 is shown as optional as it can be part of the engineered growth structure rather than a separate layer. That is, when configuring, making, or constructing the engineered growth structure, the functional aspects of the buffer 315, and those of the overshoot layer 316, can be incorporated into the engineered growth structure.

Step B1, which follows Step A1, shows a release layer 320 disposed over the engineered growth structure, and more specifically over the buffer 315. The release layer 320 may be similar to the release layer 120 described above. The release layer 320 can also be referred to as a sacrificial layer because it is generally removed during a lift-off process such as an ELO or LLO process, for example. The release layer 320 generally contains or includes an aluminum-containing compound such as AlAs, AlGaAs, (Al)InGaAs, AlInP, AlInGaP, or AlInAs, where the aluminum-containing compound is susceptible to etching in an acid such as HF while other layers remain unaffected by the HF (e.g., are acid resistant). That is, when HF is applied as part of the lift-off process, the release layer 320 is etched away in order to separate the epitaxial layer from the growth structure. In an aspect, the lattice constant of the release layer 320 can have a range based on the material composition. In one example, the lattice constant of the release layer 320 can be between 5.65 Å and 5.89 Å.

In Step C1, which follows Step B1, one or more subcells can be disposed over the release layer 320 to form part of an epitaxial layer or epitaxial stack. For example, a first subcell 325a can be disposed over the release layer 320 by, for example, epitaxially growing the first subcell 325a. Optionally, a second subcell 325b can be disposed over the first subcell 325a by, for example, epitaxially growing the second subcell 325b. Also optionally, a third subcell 325c can be disposed over the second subcell 325b by, for example, epitaxially growing the third subcell 325c.

Although the example shown in FIG. 3A includes up to three (3) subcells, it is to be understood that the application is not so limited and that the number of subcells can vary depending on the type of optoelectronic device being manufactured. Four (4), or more, subcells are also possible. Moreover, similar to the examples described above for FIG. 1A, the engineered growth structure described in FIG. 3A can be used to manufacture 1J, 2J, and 3J photovoltaic devices. For example, the first subcell 325a can be sufficient to produce the 1J photovoltaic device, where the structure of the first subcell 325a provides for the single junction. The first subcell 325a and the second subcell 325b can be sufficient to produce the 2J photovoltaic device, where the structure of the first subcell 325a provides for the first junction and the structure of the second subcell 325b provides for the second junction. The first subcell 325a, the second subcell 325b, and the third subcell 325c can be sufficient to produce the 3J photovoltaic device, where the structure of the first subcell 325a provides for the first junction, the structure of the second subcell 325b provides for the second junction, and the structure of the third subcell 325c provides for the third junction. Moreover, the photovoltaic devices having 1J, 2J, 3J or more junctions can be solar cells, and the photovoltaic devices having 1J can be light-emitting devices, for example.

The first subcell 325a, the second subcell 325b, and the third subcell 325c can have matching lattice constants. For example, each of these subcells can have a lattice constant of between 5.66 Å and 5.89 Å. In some cases, one or more of the subcells can have lattice constants below that of GaAs, for example, below 5.65-5.66 Å and as low as the lattice constant for GaP of about 5.45 Å.

Figure 3B:
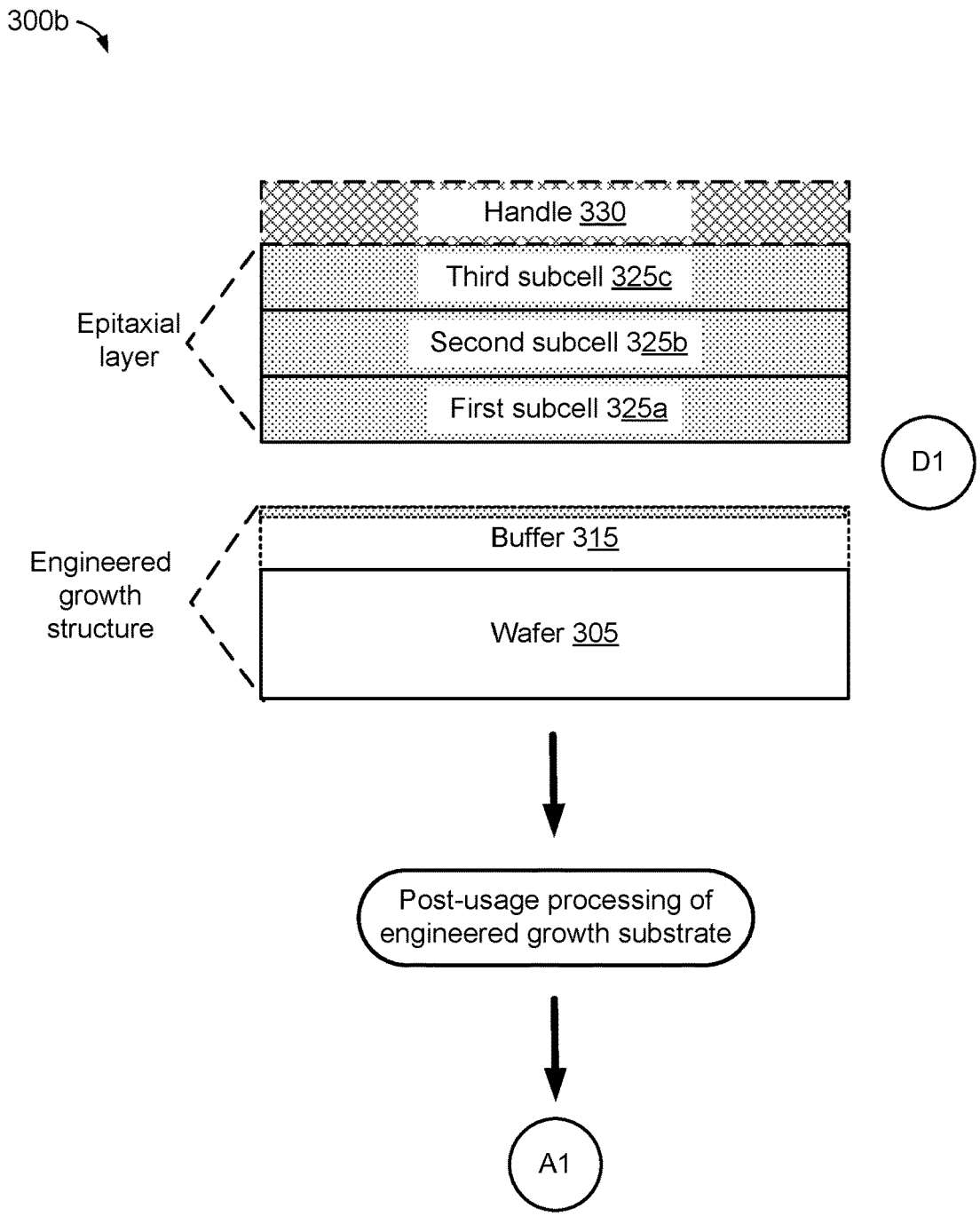

FIG. 3B shows diagram 300b that illustrates a remaining part of the process to manufacture an optoelectronic device using an engineered growth structure and a release layer as described in the diagram 300a in FIG. 3A. In Step D1, which follows Step C1 shown in FIG. 3A, a handle 330 (e.g., an ELO handle for ELO-related operations) is attached to the top subcell (e.g., the third subcell 325c when such a subcell is grown). The handle 330 can be attached using different techniques and/or materials (e.g., different types of adhesives). Upon removal of the release layer 320, the epitaxial layer having the optoelectronic device (e.g., the one or more subcells) is separated from the engineered growth structure. The engineered growth structure can then be cleaned and/or polished to be reused in Step A1 to grow additional optoelectronic devices. This cleaning and/or polishing process may involve redepositing at least part of the buffer 115 and/or the overshoot layer 116, for example.

As shown in FIGS. 3A and 3B, because a lattice transition is not needed since the engineered growth structure provides the desired lattice constant (e.g., the engineering growth structure essentially provides an engineered lattice constant), the time to grow such lattice transition is no longer part of the process to manufacture the optoelectronic device.

It is to be understood that the various layers, subcells, or structures illustrated as part of the epitaxial layer and the growth structure in FIGS. 3A and 3B are not drawn to scale and are not intended to indicate a relative thickness with respect to each other. Instead, they are provided with sufficient thickness for labeling and to make it easy to identify their order or positioning. Moreover, FIGS. 3A and 3B are not intended to illustrate the varying lattice constants in the engineered growth structure and/or the epitaxial layer.

Figure 3C:
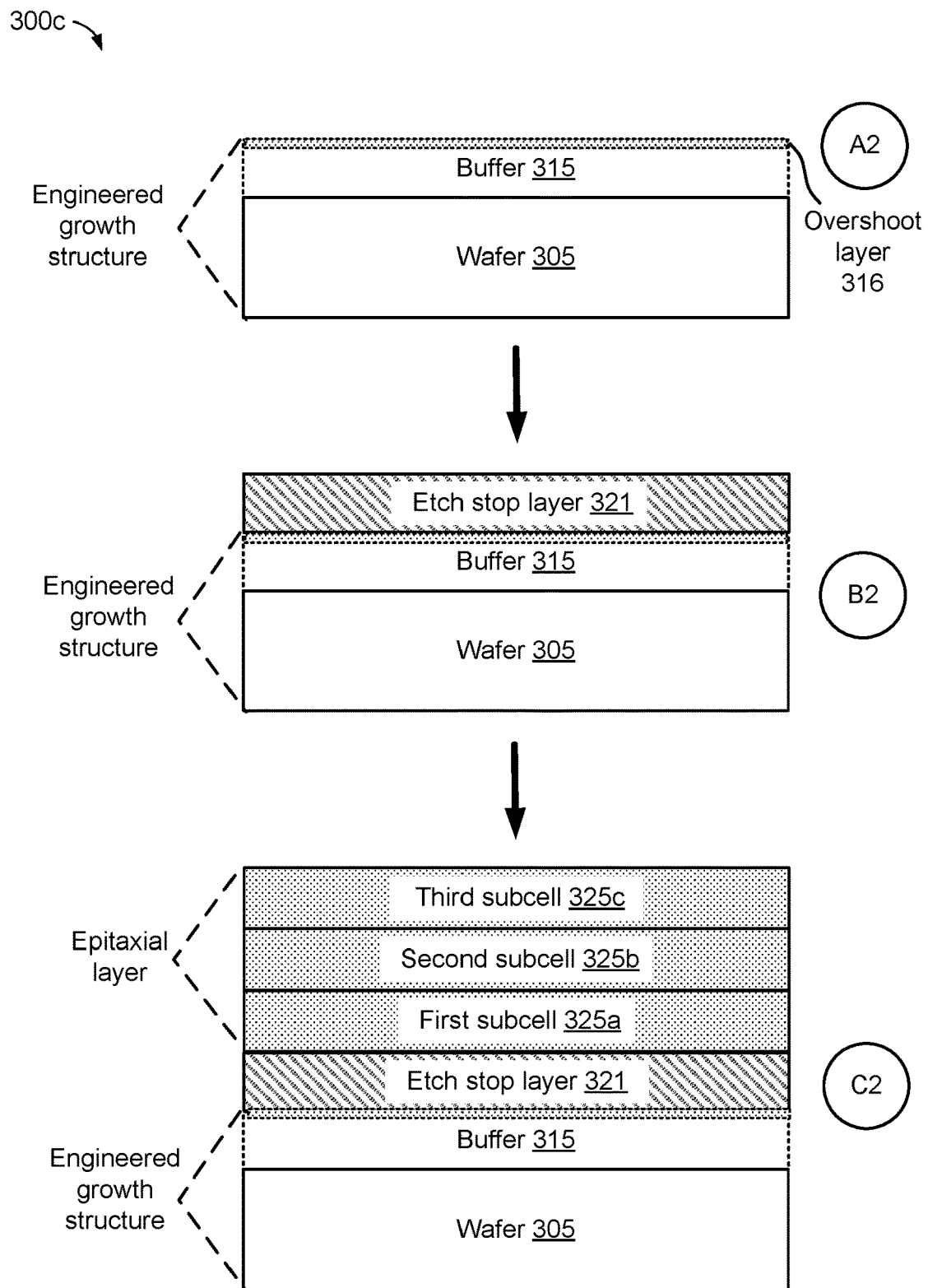
FIGS. 3C and 3D are diagrams that illustrate an example of a process to manufacture an optoelectronic device using an engineered growth structure and an etch stop layer in accordance with aspects of this disclosure.

FIG. 3C shows diagram 300c that illustrates part of a process to manufacture an optoelectronic device using an engineered growth structure and an etch stop layer. Steps A2, B2, and C2 in the diagram 300c are very similar to corresponding Steps A1, B1, and C1 in the diagram 300a in FIG. 3A. The one difference is that rather than disposing a release layer 320 over the engineered growth structure as in Step B1, in Step B2 an etch stop layer 321 is disposed instead. The etch stop layer 321 may be similar to the etch stop layer 121 described above.

Figure 3D:
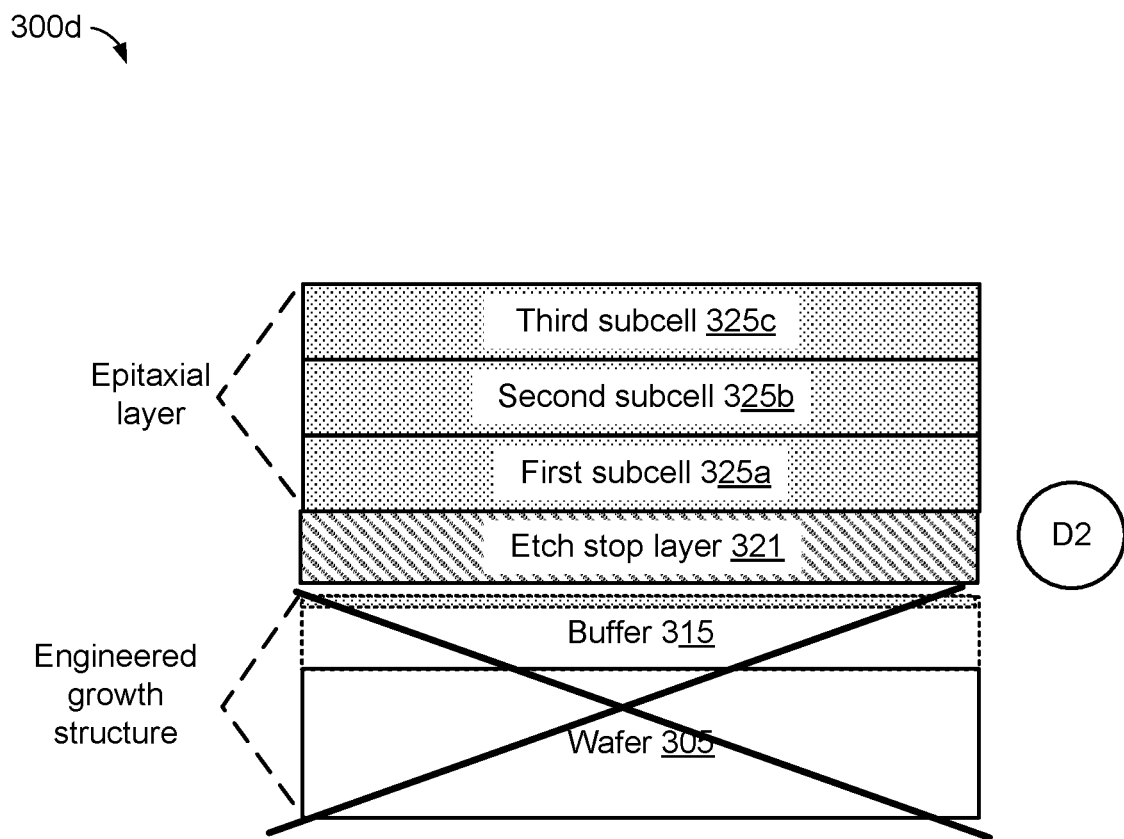

FIG. 3D shows diagram 300d that illustrates a remaining part of the process to manufacture an optoelectronic device using an engineered growth structure and an etch stop layer as described in the diagram 300c in FIG. 3C. In this case, in Step D2, the engineered growth structure, including the wafer 305 and the buffer 315, may be removed by etching, grinding, exfoliating, spalling, and/or any other similar method or process. The presence of the etch stop layer 321 ensures that whichever method or process is used, the removal of the engineered growth structure does not go beyond the etch stop layer 321, and therefore, does not affect the optoelectronic device in the epitaxial layer. The etch stop layer 321 may be made thin enough that it is kept as part of the epitaxial layer or may itself be removed by some other process different from the process used to remove the engineered growth structure. Since the engineered growth structure is clearly damaged as part of this process it may not be reused as is the case in FIG. 3B.

It is to be understood that the various layers, subcells, or structures illustrated as part of the epitaxial layer and the engineered growth structure in FIGS. 3C and 3D are not drawn to scale and are not intended to indicate a relative thickness with respect to each other. Instead, they are provided with sufficient thickness for labeling and to make it easy to identify their order or positioning. Moreover, FIGS. 3C and 3D are not intended to illustrate the varying lattice constants in the growth structure and/or the epitaxial layer.

The epitaxial layers constructed in the manner described in FIGS. 3A and 3B or in the manner described in FIGS. 3C and 3D are intended to have a small thickness. For example, these epitaxial layers having three subcells are intended to have a maximum thickness of 15 microns such that they are thin-enough to enable flexible optoelectronic devices such as flexible solar cells.

It is to be further understood that the particular examples of epitaxial layers shown in FIGS. 2A-2F can be grown based on the engineered growth structure described in connection with FIGS. 3A-3D.

Moreover, the techniques described in connection with FIGS. 3A-3D can be used to make a multi-junction (e.g., multiple subcells) optoelectronic device with lattice constant between that of GaP (5.45 Å) and that of GaAs (5.65 Å). An example of such a multi-junction device can be a triple subcell optoelectronic device having the following subcell structure (Al)GaInP/(Al)GaAsP/SiGe(Sn) with all subcells being internally lattice-matched and grown on a ternary substrate like GaAsP or GaInP with a lattice constant between that of GaP and that of GaAs.

Figure 3E:
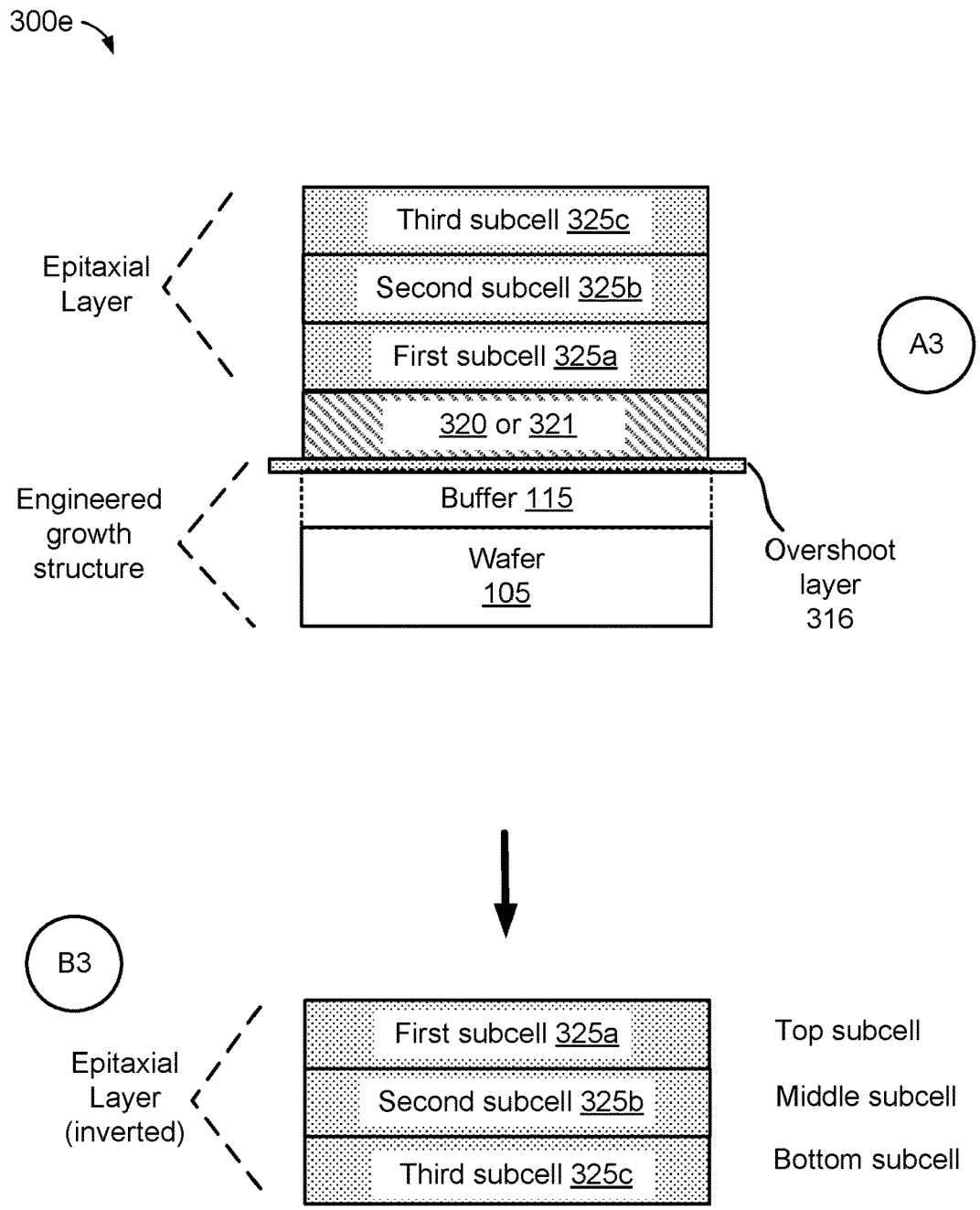
FIG. 3E is a diagram that illustrates an example of a process to manufacture an optoelectronic device with three lattice-matched subcells using a release layer or an etch stop layer in accordance with aspects of this disclosure.

FIG. 3E shows a diagram 300e that illustrates an example of a process to manufacture an optoelectronic device with three lattice-matched subcells using a release layer 320 or an etch stop layer 321. In the diagram 300e, the width of each layer is intended to illustrate or correspond to a lattice constant of that layer. For example, the wider a layer the larger the lattice constant of that layer compared to other layers.

The process involves a Step A3, which shows an engineered growth structure having a semiconductor substrate or wafer 305, and optionally a buffer 315 with the overshoot layer 316 disposed over the wafer 305. As illustrated, the lattice constant of the wafer 305 can be engineered (e.g., by a layer transfer process or from a ternary material and/or quaternary material), with the buffer 315 having the same lattice constant (e.g., same width). The overshoot layer 316 has a lattice constant larger than that of the buffer 315 to provide some strain relaxation. In some examples, the lattice constant of the engineered growth structure (e.g., of the wafer 305 and the buffer 315) may be about 5.72 Å.

Also shown is the release layer 320 or the etch stop layer 321, either one having the same width (e.g., lattice constant) as the engineered growth structure. The release layer may or may not have the same lattice constant as the engineered growth structure. On top of either of these layers, the epitaxial layer is grown with the first subcell 325*a* deposited first, the second subcell 325*b* deposited second, and the third subcell 325*c* deposited third (e.g., inverted structure). All three subcells in this example are lattice-matched (have the same width) to the engineered growth structure. For example, each of the three subcells can have a lattice constant of about 5.72 Å.

At Step B3, which follows Step A3 (and some intermediate steps not shown), the epitaxial layer is separated or isolated from the engineered growth structure by either etching or removing the release layer 320 or by etching, grinding, or removing the engineered growth structure and the etch stop layer 321. As shown, the epitaxial layer has been inverted from its growth direction to show the first subcell 325*a* as the top subcell (during operation of the optoelectronic device), the second subcell 325*b* as the middle subcell, and the third subcell 325*c* as the bottom subcell. That is, in this example, the subcells are grown sunny side down and they are then inverted after being separated from the engineered growth structure.

Figure 3F:
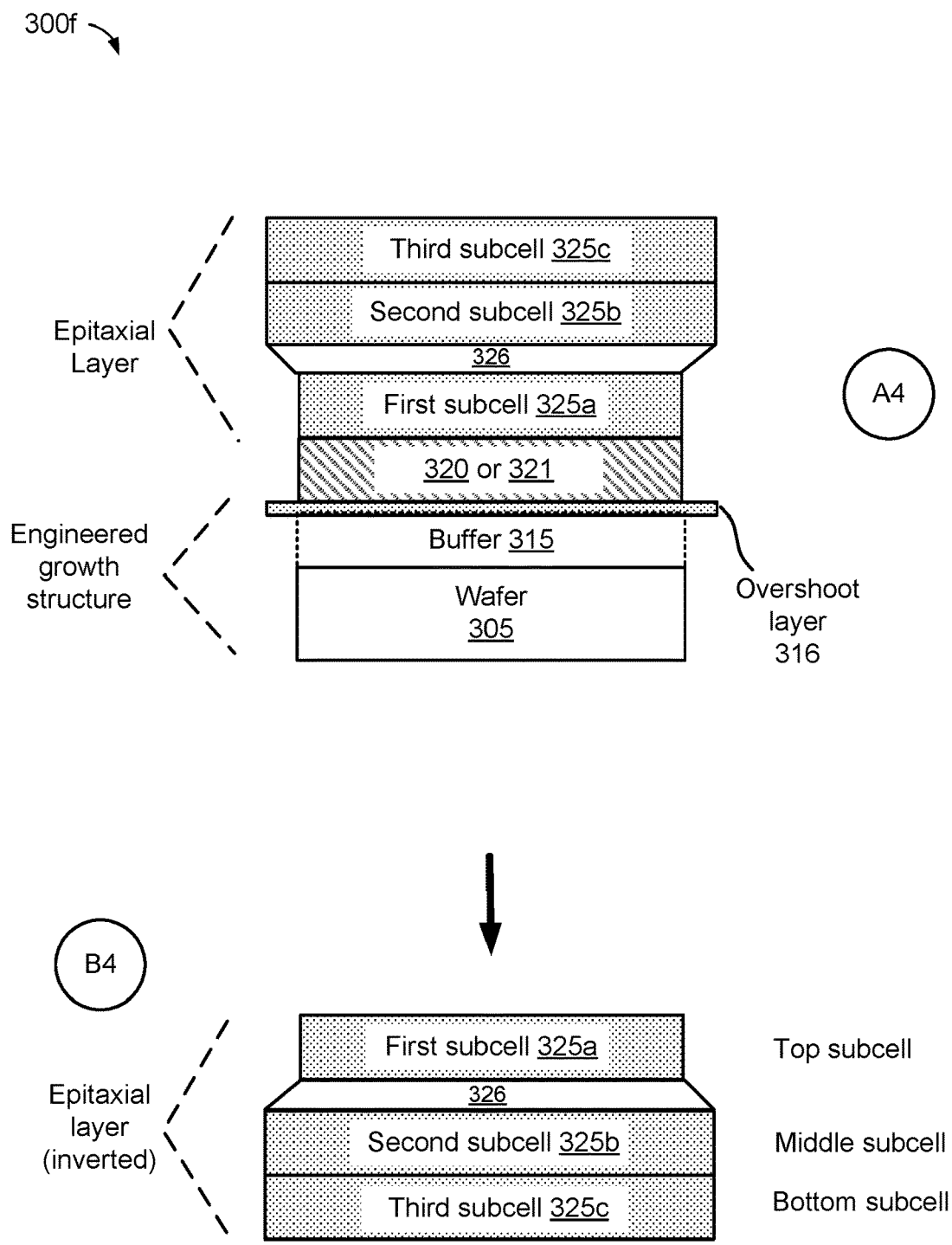
FIG. 3F is a diagram that illustrates an example of a process to manufacture an optoelectronic device with three subcells using a release layer or an etch stop layer two of which are lattice-matched in accordance with aspects of this disclosure.

FIG. 3F shows a diagram 300*f* that illustrates an example of a process to manufacture an optoelectronic device with three subcells using the release layer 320 or the etch stop layer 321 with two of the subcells being lattice-matched. In the diagram 300*f*, the width of each layer is intended to illustrate or correspond to a lattice constant of that layer. Note that the lattice constant of the mismatched subcells can be larger or smaller than the lattice constant of the lattice transition layer or the engineered growth structure.

The process involves a Step A4, which shows the engineered growth structure having the semiconductor substrate or wafer 305 and optionally the buffer 315 with the overshoot layer 316 disposed over the wafer 305. As illustrated, the lattice constant of the wafer 305 can be engineered (e.g., by a layer transfer process or from a ternary material and/or quaternary material), with the buffer 315 having the same lattice constant (e.g., same width). The overshoot layer 316 has a lattice constant larger than that of the buffer 315 to provide some strain relaxation. In some examples, the lattice constant of the engineered growth structure (e.g., of the wafer 305 and the buffer 315) may be about 5.72 Å.

Also shown is the release layer 320 or the etch stop layer 321, either one having the same width (e.g., lattice constant) as the engineered growth structure. The release layer may or may not have the same lattice constant as the engineered growth structure. On top of either of these layers, the epitaxial layer is grown with the first subcell 325*a* deposited first and having a similar lattice constant (width) as that of the engineered growth structure. For example, the first subcell 325*a* can have a lattice constant of about 5.72 Å. After the first subcell 325*a*, a graded buffer layer 326 is deposited to transition from the lattice constant of the first subcell 325*a* to a lattice constant of the second subcell 325*b*, which is greater than the lattice constant of the first subcell 325*a*. After the second subcell 325*b* is deposited, the third subcell 325*c* is deposited having a lattice constant that matches that of the second subcell 325*b*.

At Step B4, which follows Step A4 (and some intermediate steps not shown), the epitaxial layer is separated or isolated from the engineered growth structure by either etching or removing the release layer 320 or by etching, grinding, or removing the growth structure and the etch stop layer 321. As shown, the epitaxial layer has been inverted from its growth direction to show the first subcell 325*a* as the top subcell (during operation of the optoelectronic device), the second subcell 325*b* as the middle subcell with the graded buffer layer 326 between the first subcell 325*a* and the second subcell 325*b*, and the third subcell 325*c* as the bottom subcell. That is, in this example, like the example in FIG. 3E, the subcells are grown sunny side down and they are then inverted after being separated from the growth structure.

Figure 3G:
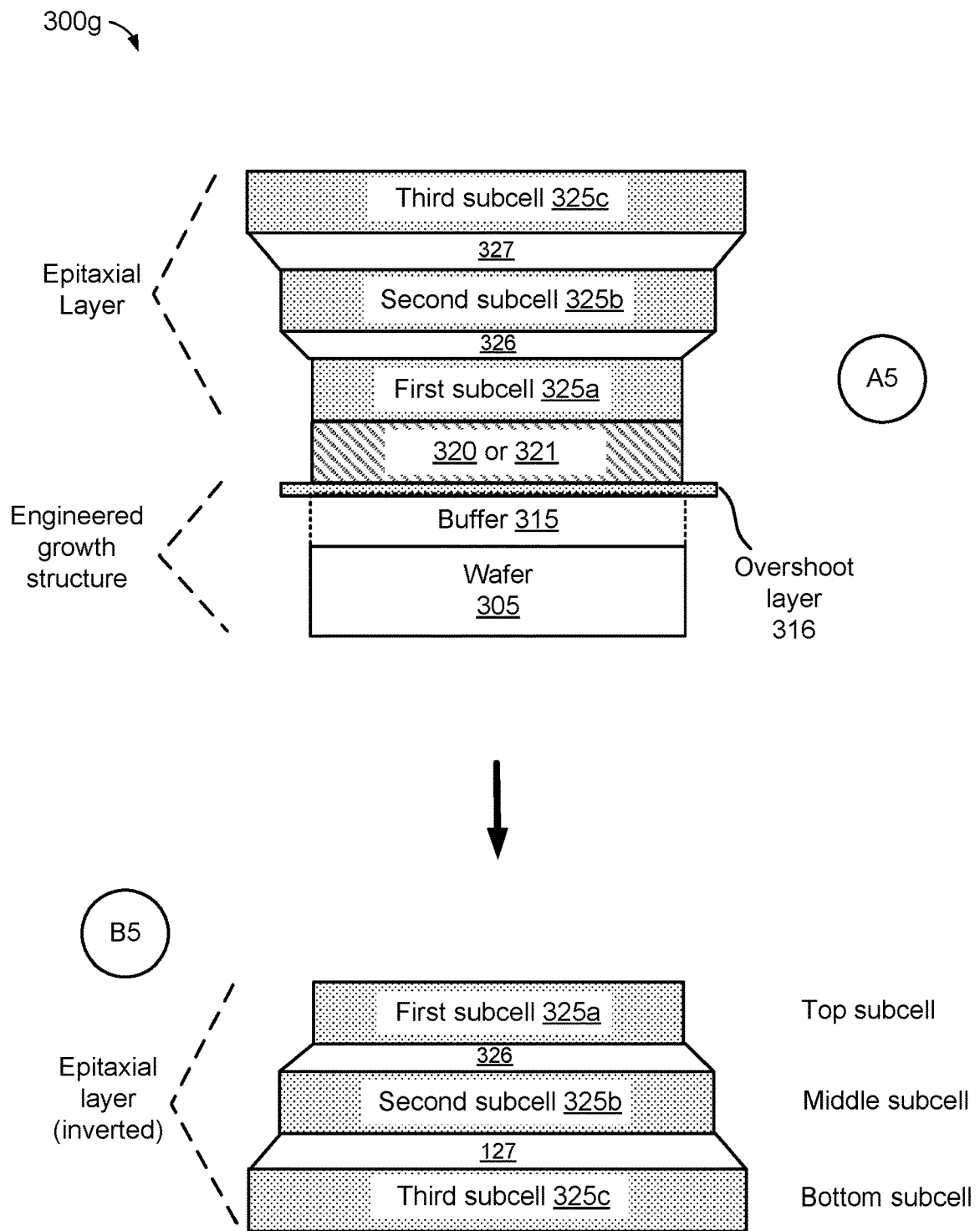
FIG. 3G is a diagram that illustrates an example of a process to manufacture an optoelectronic device with three subcells using a release layer or an etch stop layer all of which are lattice mismatched in accordance with aspects of this disclosure.

FIG. 3G shows a diagram 300*g* that illustrates an example of a process to manufacture an optoelectronic device with three subcells using the release layer 320 or the etch stop layer 321 with all of the subcells being lattice mismatched. In the diagram 300*g*, the width of each layer is intended to illustrate or correspond to a lattice constant of that layer. Note that the lattice constant of the mismatched subcells can be larger or smaller than the lattice constant of the lattice transition layer or the engineered growth structure.

The process involves a Step A5, which shows a growth structure having the semiconductor substrate or wafer 305 and optionally the buffer 315 with the overshoot layer 316 disposed over the wafer 305. As illustrated, the lattice constant of the wafer 305 can be engineered (e.g., by a layer transfer process or from a ternary material and/or quaternary material), with the buffer 315 having the same lattice constant (e.g., same width). The overshoot layer 316 has a lattice constant larger than that of the buffer 315 to provide some strain relaxation. In some examples, the lattice constant of the engineered growth structure (e.g., of the wafer 305 and the buffer 315) may be about 5.72 Å.

Also shown is the release layer 320 or the etch stop layer 321, either one having the same width (e.g., lattice constant) as the engineered growth structure. The release layer may or may not have the same lattice constant as the engineered growth substrate. On top of either of these layers, the epitaxial layer is grown with the first subcell 325*a* deposited first and having a similar lattice constant (width) as that of the engineered growth structure. For example, the first subcell 325*a* can have a lattice constant of about 5.72 Å. After the first subcell 325*a*, the graded buffer layer 326 is deposited to transition from the lattice constant of the first subcell 325*a* to a lattice constant of the second subcell 325*b*, which is greater than the lattice constant of the first subcell 325*a*. After the second subcell 325*b* is deposited, a graded buffer layer 327 is deposited to transition from the lattice constant of the second subcell 325*b* to a lattice constant of the third subcell 325*c*, which is greater than the lattice constant of the second subcell 325*b*.

At Step B5, which follows Step A5 (and some intermediate steps not shown), the epitaxial layer is separated or isolated from the growth structure by either etching or removing the release layer 320 or by etching, grinding, or removing the growth structure and the etch stop layer 321. As shown, the epitaxial layer has been inverted from its growth direction to show the first subcell 325*a* as the top subcell (during operation of the optoelectronic device), the second subcell 325*b* as the middle subcell with the graded buffer layer 326 between the first subcell 325*a* and the second subcell 325*b*, and the third subcell 325*c* as the bottom subcell with the graded buffer layer 327 between the second subcell 325b and the third subcell 325c. That is, in this example, like the examples in FIGS. 3E and 3F, the subcells are grown sunny side down and they are then inverted after being separated from the growth structure.

It is to be understood that the examples described in FIGS. 3E-3G can also be grown sunny side up, with the bottom-most subcell grown first and the top-most subcell grown last.

Moreover, the epitaxial layers constructed in the manner described in FIGS. 3E-3G are also intended to have a small thickness. For example, these epitaxial layers having three subcells (e.g., all lattice matched, all lattice mismatch, or partially lattice matched/mismatched) are intended to have a maximum thickness of 15 microns such that they are thin-enough to enable flexible optoelectronic devices such as flexible solar cells.

Figure 4A:
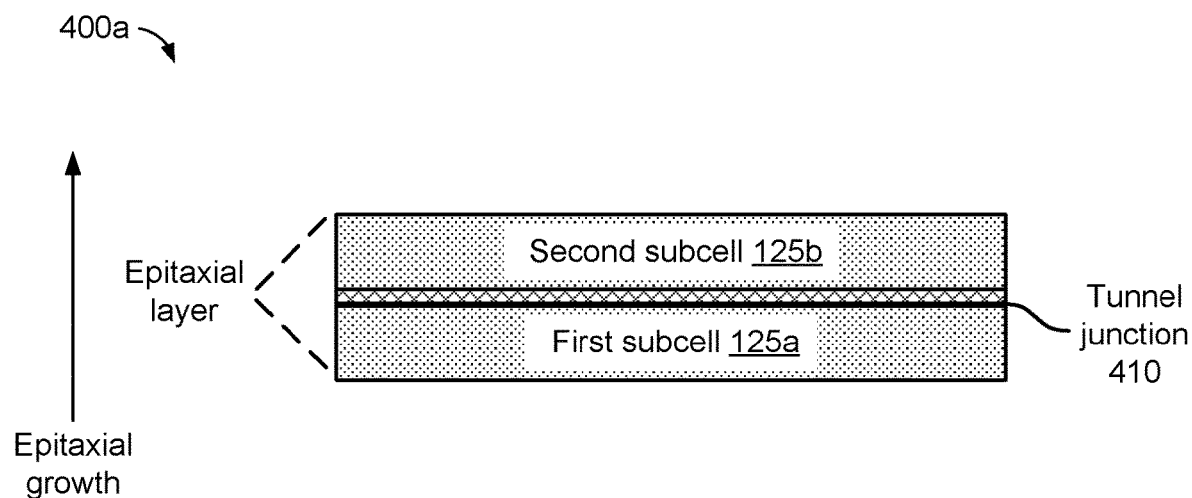
FIGS. 4A and 4B are diagrams that illustrate examples of tunnel junctions between subcells in accordance with aspects of this disclosure.
Figure 4B:
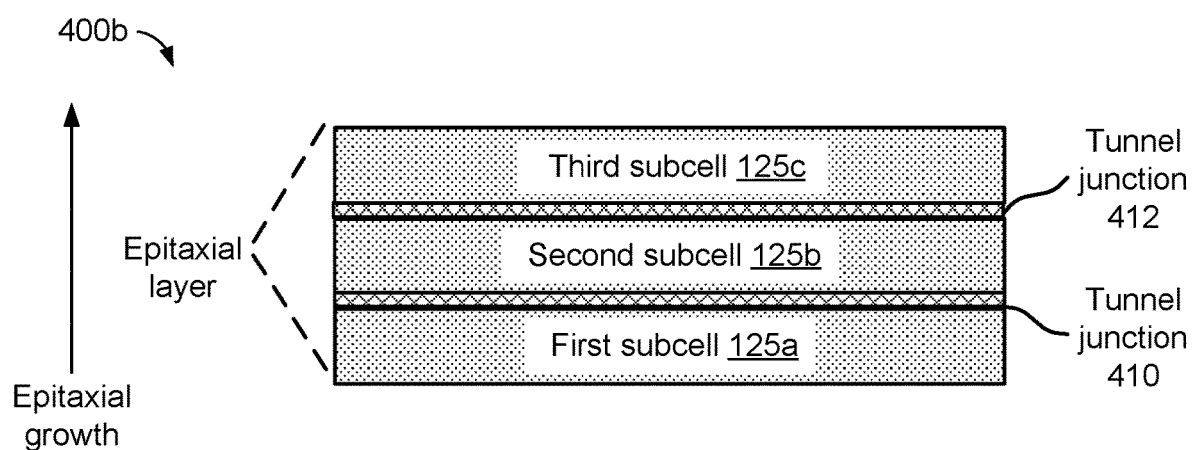

FIGS. 4A and 4B show diagrams 400a and 400b, respectively, that illustrate the use of tunnel junctions between subcells in accordance with aspects of this disclosure. In the example in the diagram 400a, an epitaxial layer is shown having two subcells, the first subcell 125a and the second subcell 125b (see e.g., FIG. 1A). The subcells are shown in their epitaxial growth order, that is, the first subcell 125a is deposited or grown first and the second subcell 125b is deposited or grown over the first subcell 125a. In this example, however, a tunnel junction 410 is deposited or grown between the first subcell 125a and the second subcell 125b.

In the example in the diagram 400b, an epitaxial layer is shown having three subcells, the first subcell 125a, the second subcell 125b, and the third subcell 125c (see e.g., FIG. 1A). The subcells are shown in their epitaxial growth order, that is, the first subcell 125a is deposited or grown first, the second subcell 125b is deposited or grown over the first subcell 125a, and the third subcell 125c is deposited or grown over the second subcell 125b. In this example, however, the tunnel junction 410 is deposited or grown between the first subcell 125a and the second subcell 125b, and a tunnel junction 412 is deposited or grown between the second subcell 125b and the third subcell 125c.

Figure 5A:
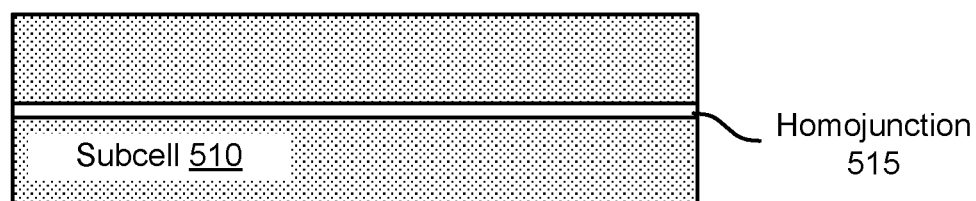
FIGS. 5A and 5B are diagrams that illustrate examples of homojunctions and heterojunctions as pn junctions in subcells in accordance with aspects of this disclosure.
Figure 5B:
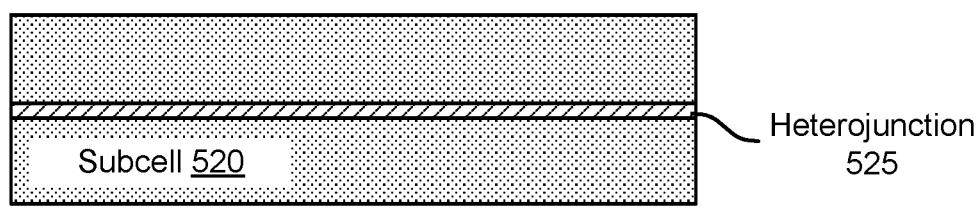

FIGS. 5A and 5B show diagrams 500a and 500b, respectively, that illustrate the use of homojunctions and heterojunctions as pn junctions in subcells in accordance with aspects of this disclosure. In the example of the diagram 500a, a subcell 510, which may be any subcell that is part of an epitaxial layer from which an optoelectronic device is formed, may include at least one pn junction (e.g., a junction between a p-doped material and an n-doped material). The pn junction can be a p-n junction, an n-p junction, or a p-i-n junction. In this example, the subcell 510 may include a homojunction 515 (e.g., a junction made of the same material with different dopings). Although a single homojunction 515 is shown, the subcell 510 may include more than one homojunction.

In the example of the diagram 500b, a subcell 520, which may be any subcell that is part of an epitaxial layer from which an optoelectronic device is formed, may include at least one pn junction. The pn junction can be a p-n junction, an n-p junction, or a p-i-n junction. In this example, the subcell 520 may include a heterojunction 525 (e.g., a junction made of different materials with different dopings). Although a single heterojunction 525 is shown, the subcell 520 may include more than one heterojunction.

It is to be understood that the examples in the diagrams 500a and 500b are provided by way of illustration and not of limitation. For example, a subcell may include one or more homojunctions, one or more heterojunctions, or a combination thereof.

Figure 5C:
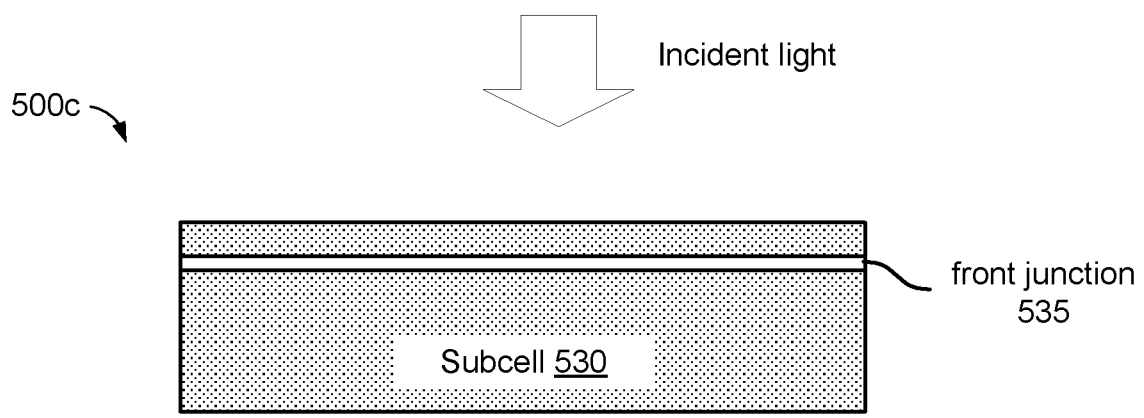
FIGS. 5C and 5D are diagrams that illustrate examples of front junctions and rear junctions as pn junctions in subcells in accordance with aspects of this disclosure.
Figure 5D:
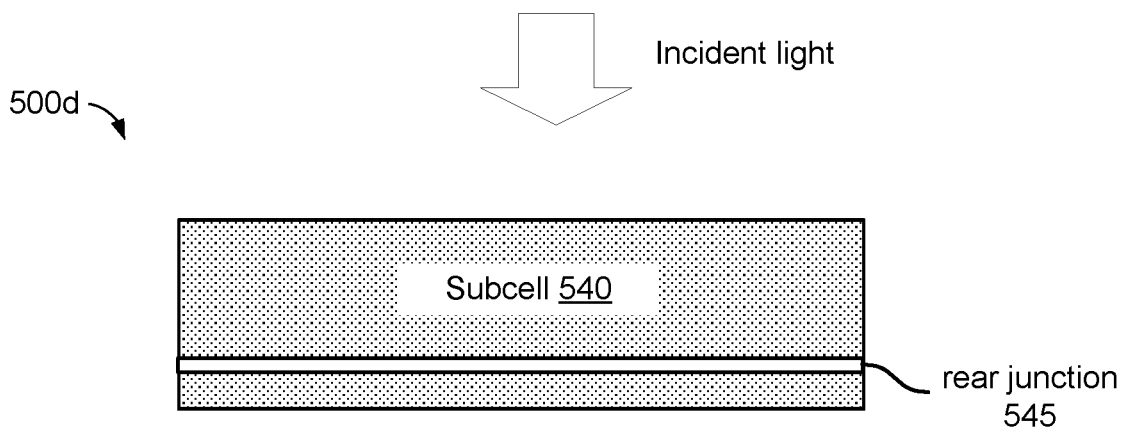

FIGS. 5C and 5D show diagrams 500c and 500d, respectively, that illustrate examples of front junctions and rear junctions as pn junctions in subcells in accordance with aspects of this disclosure. While a pn junction in a subcell can be placed in the middle of the subcell, that need not always be the case. In the example of the diagram 500c, a subcell 530, which may be any subcell that is part of an epitaxial layer from which an optoelectronic device is formed, may include at least one pn junction. In this example, the subcell 530 may include a front junction 535 (e.g., a junction made closer to the side of the subcell on which light is incident). Although a single front junction 535 is shown, the subcell 530 may include more than one front junction.

In the example of the diagram 500d, a subcell 540, which may be any subcell that is part of an epitaxial layer from which an optoelectronic device is formed, may include at least one pn junction. In this example, the subcell 540 may include a rear or back junction 545 (e.g., a junction made closer to the side of the subcell opposite to the side on which light is incident). Although a single rear junction 545 is shown, the subcell 540 may include more than one rear junction.

It is to be understood that the examples in the diagrams 500c and 500d are provided by way of illustration and not of limitation. For example, a subcell may include one or more front junctions, one or more rear junctions, or a combination thereof.

Figure 6A:
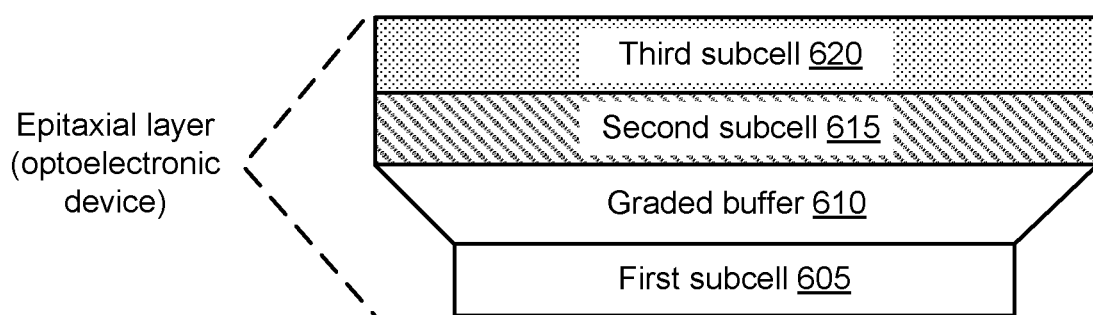
FIGS. 6A and 6B are diagrams that illustrate examples of metamorphic devices manufactured using a growth structure with a lattice transition or an engineered growth structure in accordance with aspects of this disclosure.
Figure 6B:
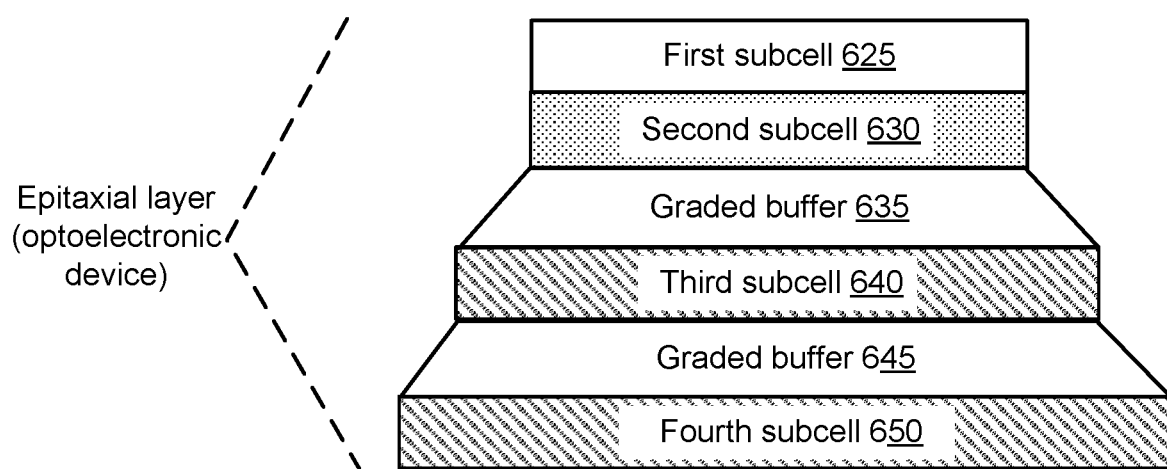

FIGS. 6A and 6B are diagrams that illustrate examples of metamorphic devices manufactured using a growth structure with a lattice transition or an engineered growth structure as described above. Metamorphic devices allow the targeting of semiconductor alloys with ideal or near-ideal bandgaps for the conversion of light into electricity. These devices use metamorphic subcells with a large range of bandgaps as well as graded buffers between two photoactive subcells, where the graded buffers have to have the proper conductivity and transparency for the transmitted portion of the spectrum.

Regarding FIG. 6A, there is shown a structure 600a referred to as an upright metamorphic device (or simply a metamorphic device) that corresponds to an epitaxial layer that can be manufactured using the methods described above in connection with FIGS. 1A-1G (growth structure with lattice transition) and FIGS. 3A-3G (engineered growth structure). In this structure, there are three (3) subcells. A first subcell 605 is shown with a graded buffer 610 disposed over the first subcell 605. The change in width shown by the block representing the graded buffer 610 is indicative of a change in the lattice constant. For example, the portion of the graded buffer 610 closest to the first subcell 605 has a smaller lattice constant (i.e., a smaller width) than the portion of the graded buffer 610 away from the first subcell 605 (i.e., a larger width).

The structure 600a also includes a second subcell 615 disposed over the graded buffer 615 and a third subcell 620 disposed over the second subcell 615. The second subcell 615 and the third subcell 620 are lattice matched as indicated by their representative blocks having the same width. Moreover, the lattice constant of the second subcell 615 and the third subcell 620 matches the lattice constant of the portion of the graded buffer 610 that is near the second subcell 615.

Regarding FIG. 6B, there is shown a structure 600b referred to as an inverted metamorphic device that corresponds to an epitaxial layer that can be manufactured using the methods described above in connection with FIGS. 1A-1G (growth structure with lattice transition) and FIGS. 3A-3G (engineered growth structure). In this structure, there are four (4) subcells. A first subcell 625 is shown disposed over a second subcell 630. The first subcell 625 and the second subcell 630 are lattice matched as indicated by their representative blocks having the same width.

The second subcell 630 is disposed over a graded buffer 635 that is in turn disposed over a third subcell 640. The change in width shown by the block representing the graded buffer 635 is indicative of a change in the lattice constant. For example, the portion of the graded buffer 635 closest to the second subcell 630 has a smaller lattice constant (i.e., a smaller width) than the portion of the graded buffer 635 closes to the third subcell 640 (i.e., a larger width).

The third subcell 640 is disposed over a graded buffer 645 that is in turn disposed over a fourth subcell 650. The change in width shown by the block representing the graded buffer 645 is indicative of a change in the lattice constant. For example, the portion of the graded buffer 645 closest to the third subcell 640 has a smaller lattice constant (i.e., a smaller width) than the portion of the graded buffer 645 closes to the fourth subcell 650 (i.e., a larger width).

It is to be understood that the structures 600a and 600b are provided by way of example and metamorphic or inverted metamorphic devices with different structures (e.g., different types of subcells, different number of subcells) can also be manufactured using the methods described above in connection with FIGS. 1A-1G (growth structure with lattice transition) and FIGS. 3A-3G (engineered growth structure).

Figure 7:
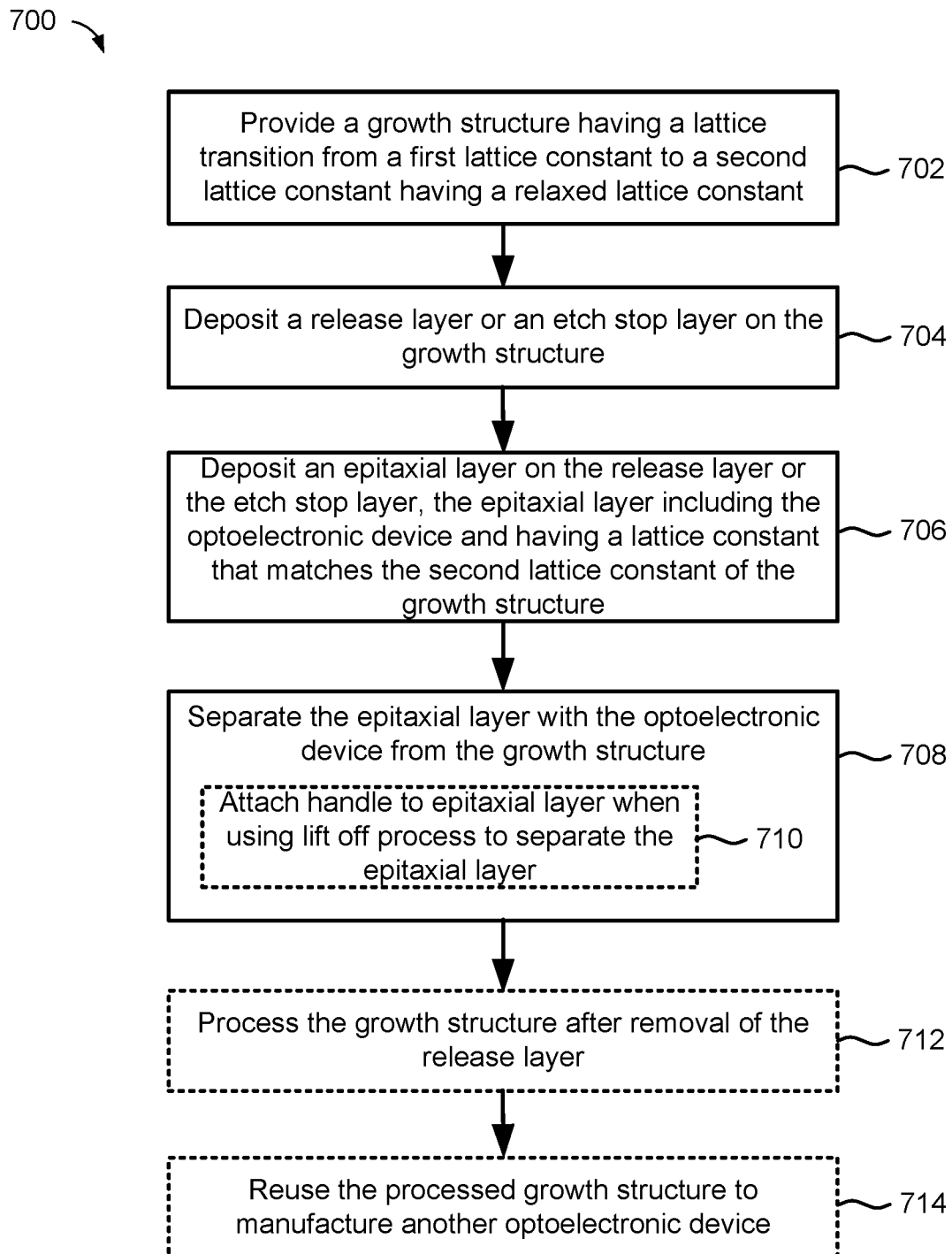
FIG. 7 is a flow chart that illustrates an example of a process to manufacture an optoelectronic device using a growth structure with a lattice transition in accordance with aspects of this disclosure.

FIG. 7 is a flowchart that illustrates a process or method 700 to manufacture an optoelectronic device using a growth structure with a lattice transition and a release layer or an etch stop layer. The method 700 illustrated in FIG. 7 corresponds at least in part to the process described above in connection with FIGS. 1A-1G.

At block 702, the method 700 includes providing a growth structure having a lattice transition (e.g., lattice transition 110) from a first lattice constant to a second lattice constant having a relaxed lattice constant.

At block 704, the method 600 includes depositing a release layer (e.g., release 120) on the growth structure or an etch stop layer (e.g., etch stop layer 121) on the growth structure.

At block 706, the method 700 includes depositing an epitaxial layer on the release layer or the etch stop layer, where the epitaxial layer includes the optoelectronic device and has a lattice constant that matches the second lattice constant of the growth structure.

At block 708, the method 700 includes separating the epitaxial layer with the optoelectronic device from the growth structure. For example, when a release layer is used, the release layer may be etched away through a lift-off process (e.g., ELO or LLO process) for the separation to take place. In another example, when an etch stop layer is used, the growth structure may be removed by etching, polishing, grinding, spalling, or some combination thereof, with the etch stop layer providing a limit to the removal process so that the epitaxial layer and the optoelectronic device are not affected. At block 710 in block 708, the method 700 may optionally include attaching a handle (e.g., the handle 130, the handle 330) to the epitaxial layer to separate the epitaxial layer from the growth structure when a release layer is used and removed.

At block 712, the method 700 optionally includes the processing of the growth structure (e.g., cleaning and/or polishing) after the removal of a release layer. Note that the growth structure is either significantly damaged or removed when an etch stop layer is used and therefore it is not further processed.

At block 714, the method 700 optionally includes the reuse of the processed growth structure to manufacture additional optoelectronic devices.

In another aspect of the method 700, the growth structure includes a graded layer (e.g., graded buffer layer 210) that provides the transition from the first lattice constant to the second lattice constant having the relaxed lattice constant. In another aspect, the growth structure includes a buffer layer (e.g., (Al)InGaAs or (Al)InGaP buffer 215) deposited over the graded layer, where the release layer or the etch stop layer is deposited over the buffer layer.

In another aspect of the method 700, the epitaxial layer includes at least one subcell that forms the optoelectronic device. For example, the optoelectronic device can be a single-junction photovoltaic device, and the at least one subcell includes a single subcell. The single subcell may be an (Al)InGaAs subcell, for example (see e.g., FIG. 2A). Moreover, the first lattice constant is in the range of 5.65 Angstroms (Å) to 5.66 Å and the second lattice constant is in the range of 5.661 Å to 5.69 Å. In one example, the second lattice constant is 5.67 Å.

In another example, the optoelectronic device can be a dual-junction photovoltaic device, and the at least one subcell includes a first subcell and a second subcell. The first subcell can be an InGaP subcell, an (Al)InGaAsP subcell or an (Al)InGaAs subcell positioned closest to the release layer or the etch stop layer, and the second subcell can be an (Al)InGaAs subcell or an (Al)InGaAs subcell disposed over the first subcell, for example (see e.g., FIG. 2B). Moreover, the first lattice constant can be in the range of 5.65 Å to 5.66 Å and the second lattice constant can be in the range of 5.67 Å to 5.85 Å. In one example, the second lattice constant is 5.74 Å.

In yet another example, the optoelectronic device can be a triple-junction photovoltaic device, and the at least one subcell includes a first subcell, a second subcell, and a third subcell. The first subcell can be an AlInP subcell or an AlInGaP subcell positioned closest to the release layer, the second subcell can be an InGaP subcell, an (Al)InGaAsP subcell or an (Al)InGaAs subcell disposed over the first subcell, and the third subcell can be an (Al)InGaAs subcell disposed over the second subcell (see e.g., FIG. 2C).

Moreover, the first lattice constant is about 5.655+/−0.005 Å or 5.65+/−0.01 Å, and the second lattice constant is in the range of 5.661 Å to 5.89 Å, the second lattice constant being based partly on the number of junctions in the optoelectronic device. In one example, the second lattice constant is 5.80 Å.

In yet another example, the optoelectronic device can be a photovoltaic device with more than three junctions, and the at least one subcell includes more than three subcells.

In another aspect of the method 700, the optoelectronic device can be a light-emitting device. For example, each subcell may be configured to generate a different portion of a light spectrum.

In another aspect of the method 700, the growth structure includes a Group III-V semiconductor material (e.g., a material made from alloys of indium, gallium, and arsenic). For example, the Group III-V semiconductor material can be GaAs, GaInP, or GaAsP.

In another aspect of the method 700, one or more of the wafer, the lattice transition, the release layer, the etch stop layer, or the epitaxial layer may each include a Group III-V semiconductor material.

In another aspect of the method 700, removing the release layer comprises removing the release layer by a lift-off process such as, for example, an ELO processor or an LLO process. Moreover, the release layer can include an aluminum-containing compound, where the aluminum-containing compound is one of AlAs, AlInP, AlGaAs, or AlInAs, and where the aluminum-containing compound is susceptible to etching by an acid such as hydrofluoric acid (HF) (e.g., as part of an etching operation in the ELO process).

In another aspect of the method 700, the growth structure includes a graded layer that provides the transition from the first lattice constant to the second lattice constant having a relaxed lattice constant, and where the graded layer is a compositionally graded buffer. The compositionally graded buffer includes (Al)InGaAs or InGaP, and the transition from the first lattice constant to the second lattice constant in the compositionally graded buffer is achieved by changing the stoichiometry of the (Al)InGaAs or the InGaP (e.g., the relationship between relative quantities in the compound materials).

In another aspect of the method 700, the optoelectronic device can be a metamorphic device (e.g., FIG. 6A) or the optoelectronic device can be an inverted metamorphic device (e.g., FIG. 6B).

In another aspect of the method 700, the second lattice constant ranges from a lattice constant of GaAs (5.65 Å) to a lattice constant of InP (5.87 Å).

In another aspect of the method 700, the second lattice constant ranges from a lattice constant of GaP (5.45 Å) to a lattice constant of GaAs (5.65 Å).

In another aspect of the method 700, being lattice matched includes having bulk epitaxial layers with thickness greater than 300 nanometers and with a lattice mismatch that is less than 500 arc-seconds.

In another aspect of the method 700, the method 700 may be used to manufacture an optoelectronic device having an epitaxial layer as described in FIGS. 1E-1G.

Figure 8:
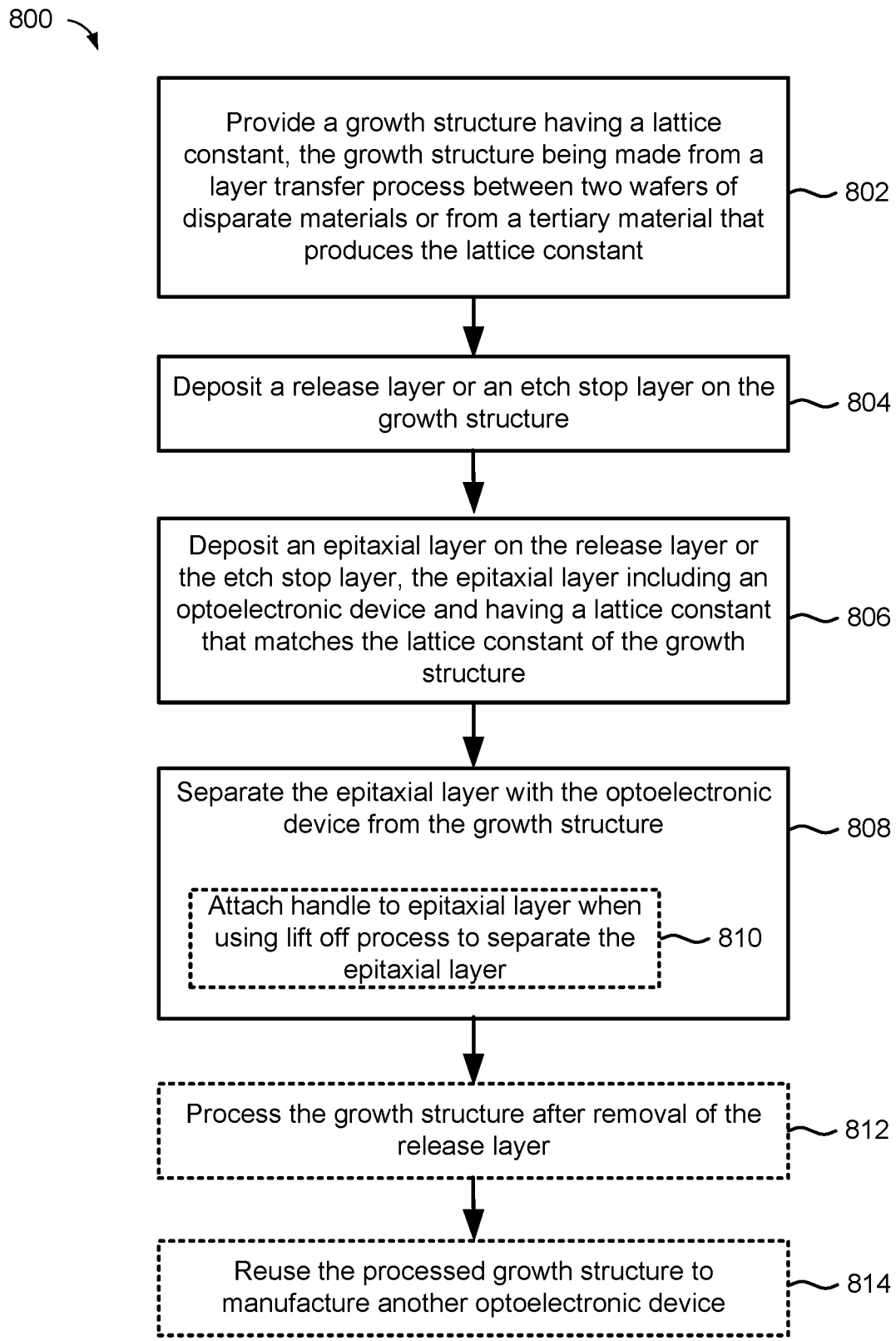
FIG. 8 is a flow chart that illustrates an example of a process to manufacture an optoelectronic device using an engineered growth structure in accordance with aspects of this disclosure.

FIG. 8 is a flowchart that illustrates a process or method 800 to manufacture an optoelectronic device using an engineered growth structure and a release layer or an etch stop layer. The method 800 illustrated in FIG. 8 corresponds at least in part to the process described above in connection with FIGS. 3A-3G.

At block 802, the method 800 includes providing an engineered growth structure (also referred to as an engineered virtual growth substrate) having a lattice constant, the engineered growth structure being made from a layer transfer process between two wafers of disparate materials (e.g., wafer bonding) or from a ternary material (e.g., InGaAs, InGaP, GaAsP or GaAsSb) and/or quaternary material (e.g., AlInGaAs) that produces the lattice constant.

At block 804, the method 800 includes depositing a release layer (e.g., release 320) on the engineered growth structure or an etch stop layer (e.g., etch stop layer 321) on the engineered growth structure.

At block 806, the method 800 includes depositing an epitaxial layer on the release layer or the etch stop layer, where the epitaxial layer includes the optoelectronic device and has a lattice constant that matches the lattice constant of the engineered growth structure.

At block 808, the method 800 includes separating the epitaxial layer with the optoelectronic device from the engineered growth structure. For example, when a release layer is used, the release layer may be etched away through a lift-off process (e.g., ELO or LLO process) for the separation to take place. In another example, when an etch stop layer is used, the engineered growth structure may be removed by etching, polishing, grinding, spalling, or some combination thereof, with the etch stop layer providing a limit to the removal process so that the epitaxial layer and the optoelectronic device are not affected. At block 810 in block 808, the method 800 may optionally include attaching a handle (e.g., the handle 130, the handle 330) to the epitaxial layer to separate the epitaxial layer from the engineered growth structure when the release layer is used and removed.

At block 812, the method 800 optionally includes the processing of the engineered growth structure (e.g., cleaning and/or polishing) after the removal of the release layer.

At block 814, the method 800 optionally includes the reuse of the processed engineered growth structure to manufacture additional optoelectronic devices.

In another aspect of the method 800, the lattice constant of the engineered growth structure ranges from a lattice constant of GaAs (5.65 Å) to a lattice constant of InP (5.87 Å).

In another aspect of the method 800, the lattice constant of the engineered growth structure ranges from a lattice constant of GaP (5.45 Å) to a lattice constant of GaAs (5.65 Å).

In another aspect of the method 800, being lattice matched includes having bulk epitaxial layers with thickness greater than 300 nanometers and with a lattice mismatch that is less than 500 arc-seconds.

In another aspect of the method 800, the method 800 may be used to manufacture an optoelectronic device having an epitaxial layer as described in FIGS. 3E-3G.

By using method 800 or a similar method, an optoelectronic device with an epitaxial layer with one or more subcells may be manufactured. The one or more subcells may include a first subcell, a second subcell, and a third subcell, all of which are internally matched within the epitaxial layer, the first subcell being made of GaInP or AlGaInP, the second subcell being made of GaAsP or AlGaAsP, the third subcell being made of SiGe or SiGeSn, the engineered growth structure having a ternary substrate made of GaAsP or GaInP and having a lattice constant ranging between the lattice constant of GaP and the lattice constant of GaAs.

Figure 9:
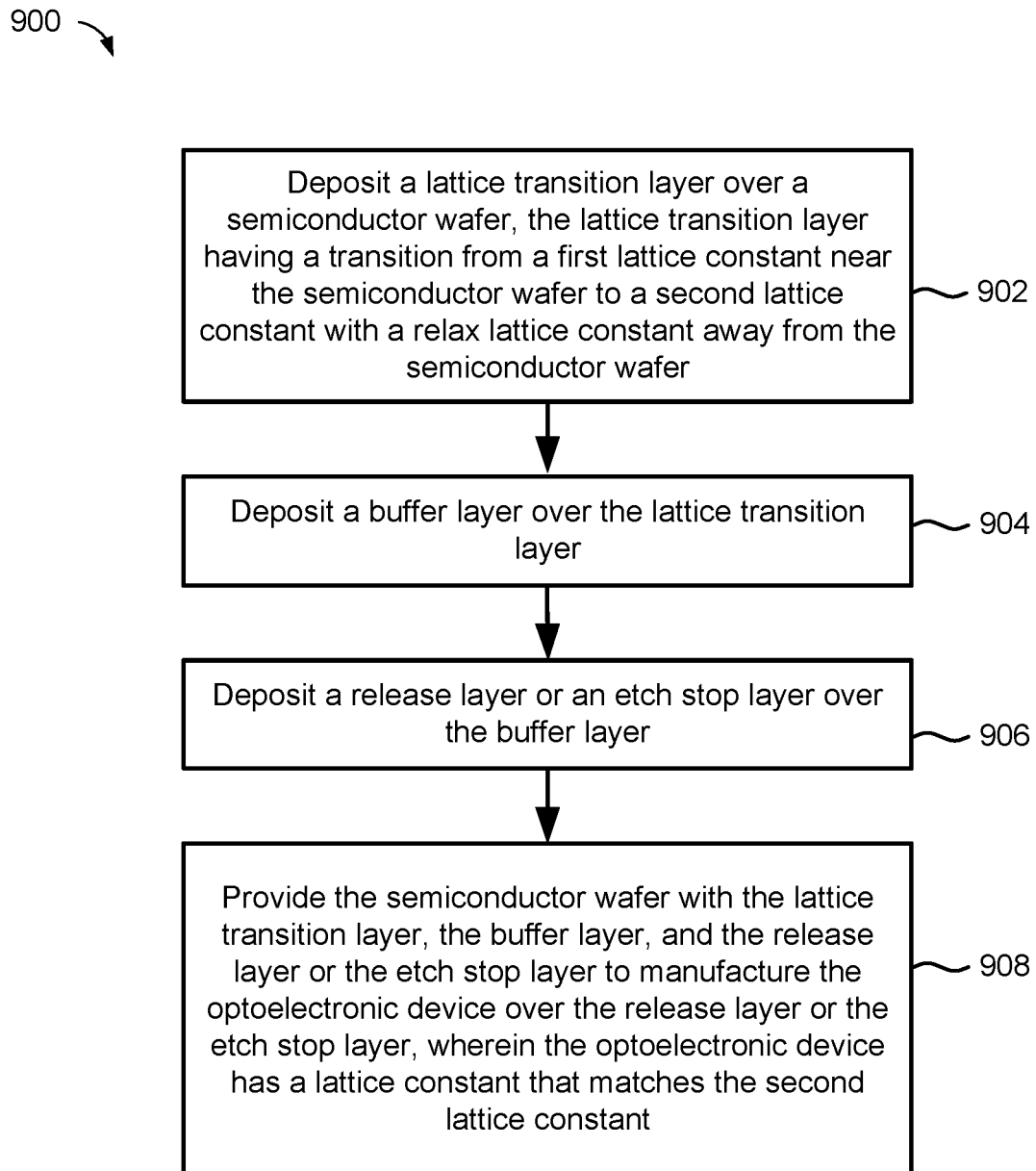
FIG. 9 is a flow chart that illustrates an example of a process to make a semiconductor structure with a lattice transition in accordance with aspects of this disclosure.

FIG. 9 is a flow chart that illustrates a process or method 900 to make a semiconductor structure with a lattice transition in accordance with aspects of this disclosure.

At block 902, the method 900 includes depositing a lattice transition or lattice transition layer (e.g., lattice transition 110) over a semiconductor wafer (e.g., the wafer 105), the lattice transition layer having a transition from a first lattice constant near the semiconductor wafer to a second lattice constant away from the semiconductor wafer and having a relaxed lattice constant.

At block 904, the method 900 includes depositing a buffer or buffer layer (e.g., the buffer 115) over the lattice transition layer.

At block 906, the method 900 includes depositing a release layer (e.g., the release layer 120) over the buffer layer or an etch stop layer (e.g., etch stop layer 121) over the buffer layer.

At block 908, the method 900 includes providing the semiconductor wafer with the lattice transition layer, the buffer layer, and the release layer or the etch stop layer to manufacture the optoelectronic device over the release layer or the etch stop layer, wherein the optoelectronic device has a lattice constant that matches the second lattice constant.

In another aspect of the method 900, the buffer or buffer layer may have an overshoot layer (e.g., the overshoot layer 116).

Figure 10A:
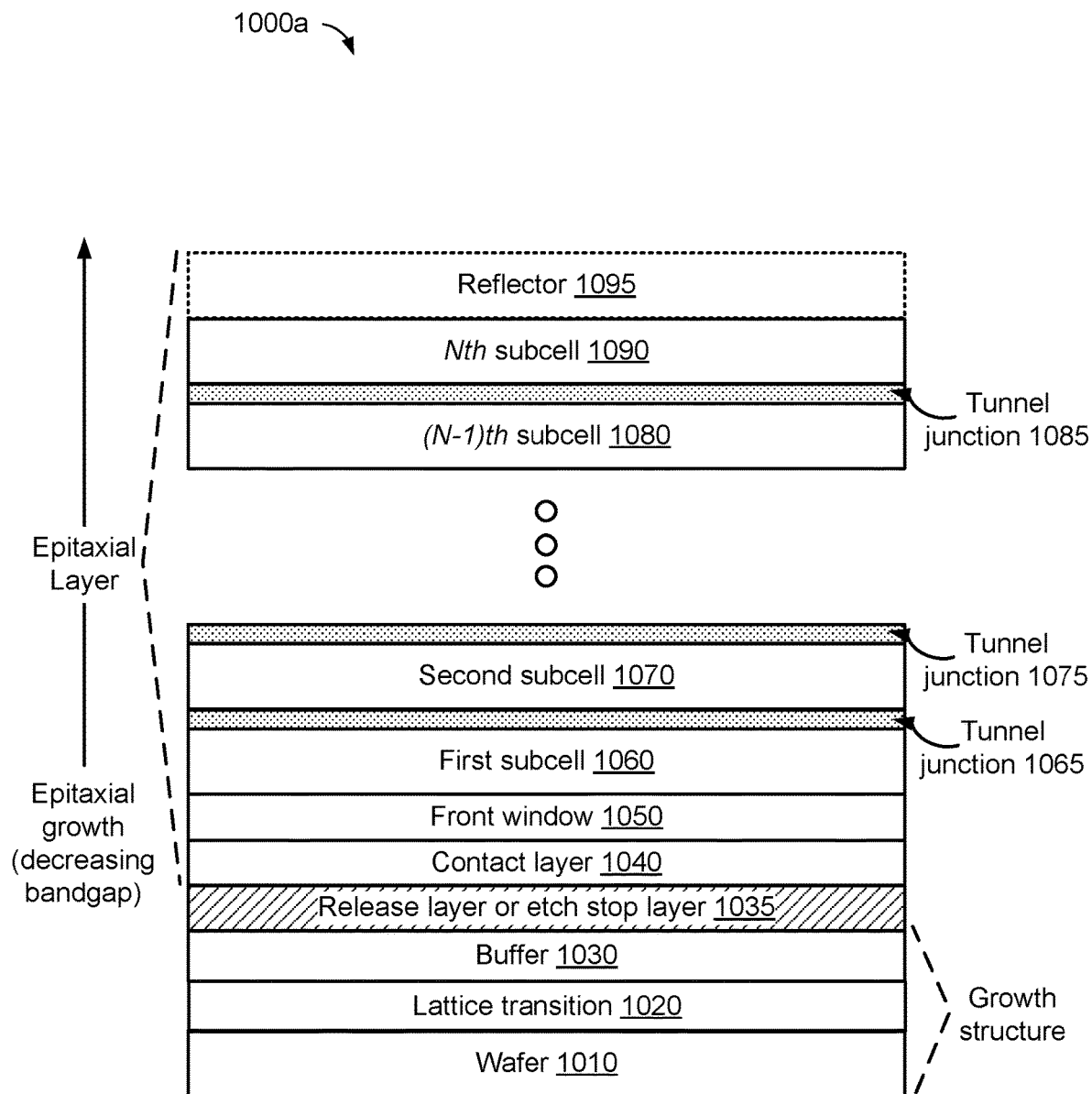
FIGS. 10A, 10B, 11, and 12 are diagrams that illustrate examples of a multi-junction optoelectronic device having multiple subcells and additional layers in accordance with aspects of this disclosure.

FIG. 10A shows a diagram 1000a that illustrates a general example of an optoelectronic device having multiple subcells (e.g., a multi-junction optoelectronic device). In this non-limiting example, there is a growth structure having a wafer 1010 (e.g., the wafer 105). The growth structure also includes a lattice transition 1020 (e.g., the lattice transition 110) disposed over the wafer 1010, and a buffer 1030 (e.g., the buffer 115) disposed over the lattice transition 1020. Although not shown, an overshoot layer may also be included. A release layer or etch stop layer 1035 is disposed over the growth structure, and more particularly, over the buffer 1030 (or the overshoot layer). In a diagram 1000b in FIG. 10B, an engineered growth structure with a wafer 1010a having a desired lattice constant and no transition layer may be used instead of the type of growth structure used in the example in the diagram 1000a.

Over the release layer or etch stop layer 1035 an epitaxial layer is grown having a contact layer 1040, a front window 1050 formed over the contact layer 1040, and one of more subcells formed over the front window 1050. In this example, there are N subcells, where N is an integer number, including a first subcell 1060, a second subcell 1070, . . . , an (N−1)th subcell 1080, and an Nth subcell 1090. Also shown are tunnel junctions between the subcells, including a tunnel junction 1065 between the first subcell 1060 and the second subcell 1070, a tunnel junction 1075 between the second subcell 1070 and another subcell (not shown) over the second subcell 1070, and a tunnel junction 1085 between the (N−1)th subcell 1080 and the Nth subcell 1090. Optionally, a reflector 1095 (also referred to as a back reflector) and/or other optically engineered layers may be formed over the top subcell, which in this example is the Nth subcell 1090.

It is to be understood that while the example in the diagram 1000a in FIG. 10A shows two or more subcells, the disclosure is not so limited and the number of subcells can vary from one subcell to three or more subcells.

The contact layer 1040 can be heavily n-doped. In some implementations, the doping concentration can be within a range greater than about $5 \times 10^{18}$ cm$^{-3}$, for example, from greater than about $5 \times 10^{18}$ cm$^{-3}$ to about $5 \times 10^{19}$ cm$^{-3}$. The high doping of the contact layer 1040 allows an ohmic contact to be formed with a later-deposited metal layer without any annealing step performed to form such an ohmic contact. The contact layer typically matches the lattice constant of the engineered growth structure.

The contact layer 1040 can be InGaAs doped with silicon (Si). For example, in some implementations in which a high-growth rate, as described above, is used to form the layers of the multi-junction optoelectronic device, a silicon dopant (as an n-dopant) can be used to bring the doping concentration to $5 \times 10^{18}$ cm$^{-3}$ or greater. For example, a precursor disilane can be introduced in a fast growth rate process to deposit the silicon dopant. In other implementations, selenium (Se) or tellurium (Te) can be used as a dopant in the formation of at least some of the layers of multi-junction optoelectronic device.

Figure 10B:
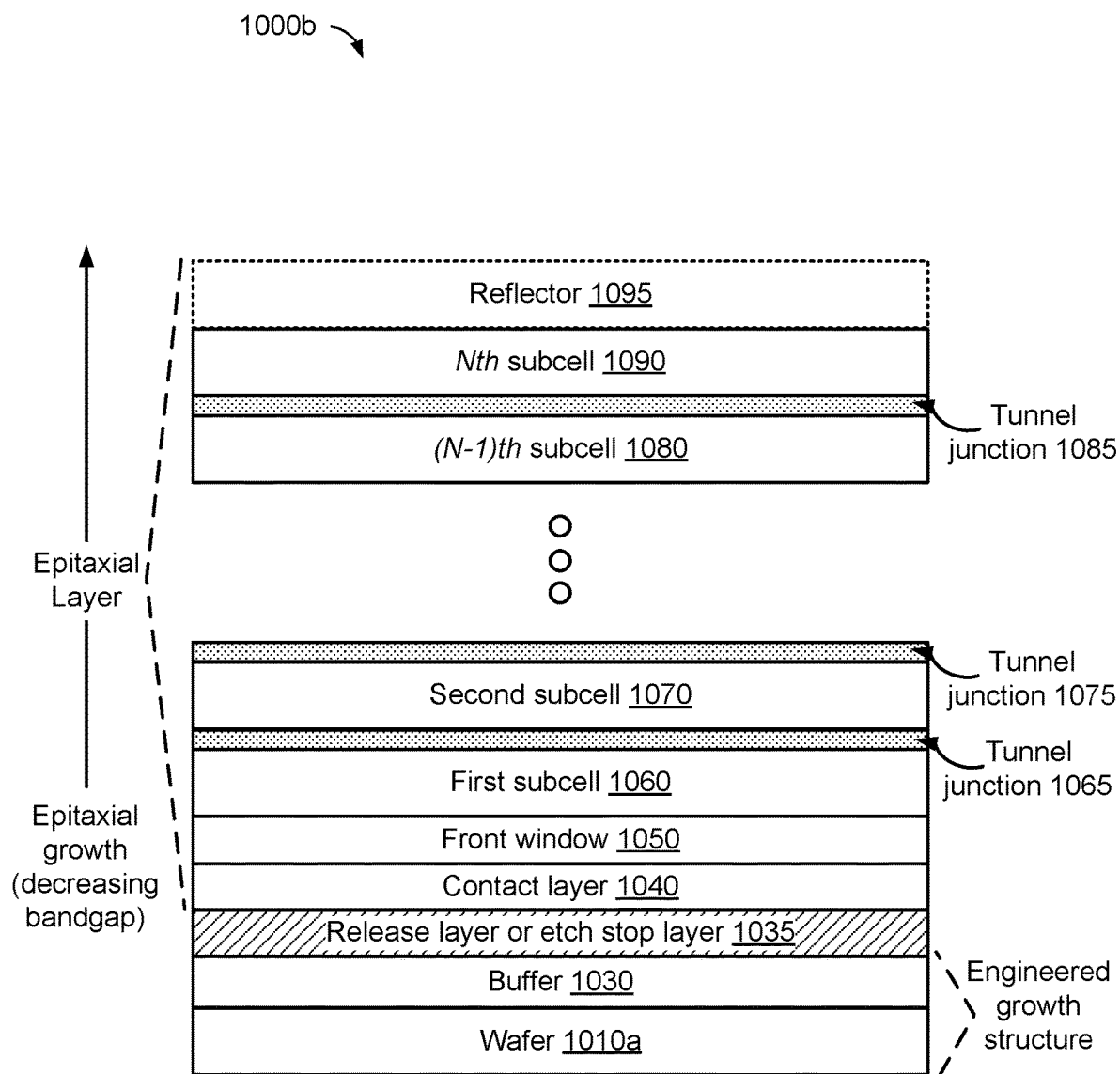

In the example shown in the diagram 1000a, the contact layer 1040 is formed before the multi-junction optoelectronic device (e.g., the epitaxial layer) is removed or separated from the growth structure (e.g., the wafer 1010, the lattice transition 1020, and the buffer 1030), or from an engineered growth structure if one is used instead (see e.g., the diagram 1000b in FIG. 10B). The contact layer 1040, however, may be formed at a later time.

A support layer (not shown) can be deposited on the last grown subcell either before or after the multi-junction optoelectronic device (e.g., from the contact layer 1040 to top subcell 1090 or the reflector 1095) is separated from the growth structure either by a lift-off process that removes the release layer 1035 or an etching, polishing, grinding, or spalling process that removes the etch stop layer 1035. When deposited before the separation, the multi-junction optoelectronic device and the support layer can be lifted off (e.g., separated, removed) together from the growth structure.

The support layer can include one or more of a dielectric layer, a semiconductor contact layer (or simply contact layer), a passivation layer, a transparent conductive oxide layer, an anti-reflective coating, a metal coating, an adhesive layer, an epoxy layer, or a plastic coating. In an embodiment or implementation, the support layer is composed of one or more materials that have a chemical resistance to acids, for example, to acids that are used as part of a liftoff process (e.g., ELO). In those instances in which a dielectric layer is included as part of a support layer, the dielectric layer includes dielectric materials that are organic or inorganic. The organic dielectric materials comprise any of polyolefin, polycarbonate, polyester, epoxy, fluoropolymer, derivatives thereof and combinations thereof and the inorganic dielectric materials comprise any of arsenic trisulfide, arsenic selenide, a alumina (sapphire), magnesium fluoride, derivatives thereof and combinations thereof. In those instances in which a contact layer (or multiple contact layers) is included as part of a support layer, the contact layer can contain Group III-V semiconductor materials, such as GaAs, depending on the desired composition of the final multi-junction optoelectronic device.

In addition, the optoelectronic devices in FIGS. 10A and 10B may include at least one emitter layer and at least one absorber layer. Moreover, these optoelectronic devices may include one or both of a back-surface field (BSF) or a back-surface reflector (BSR).

Figure 11:
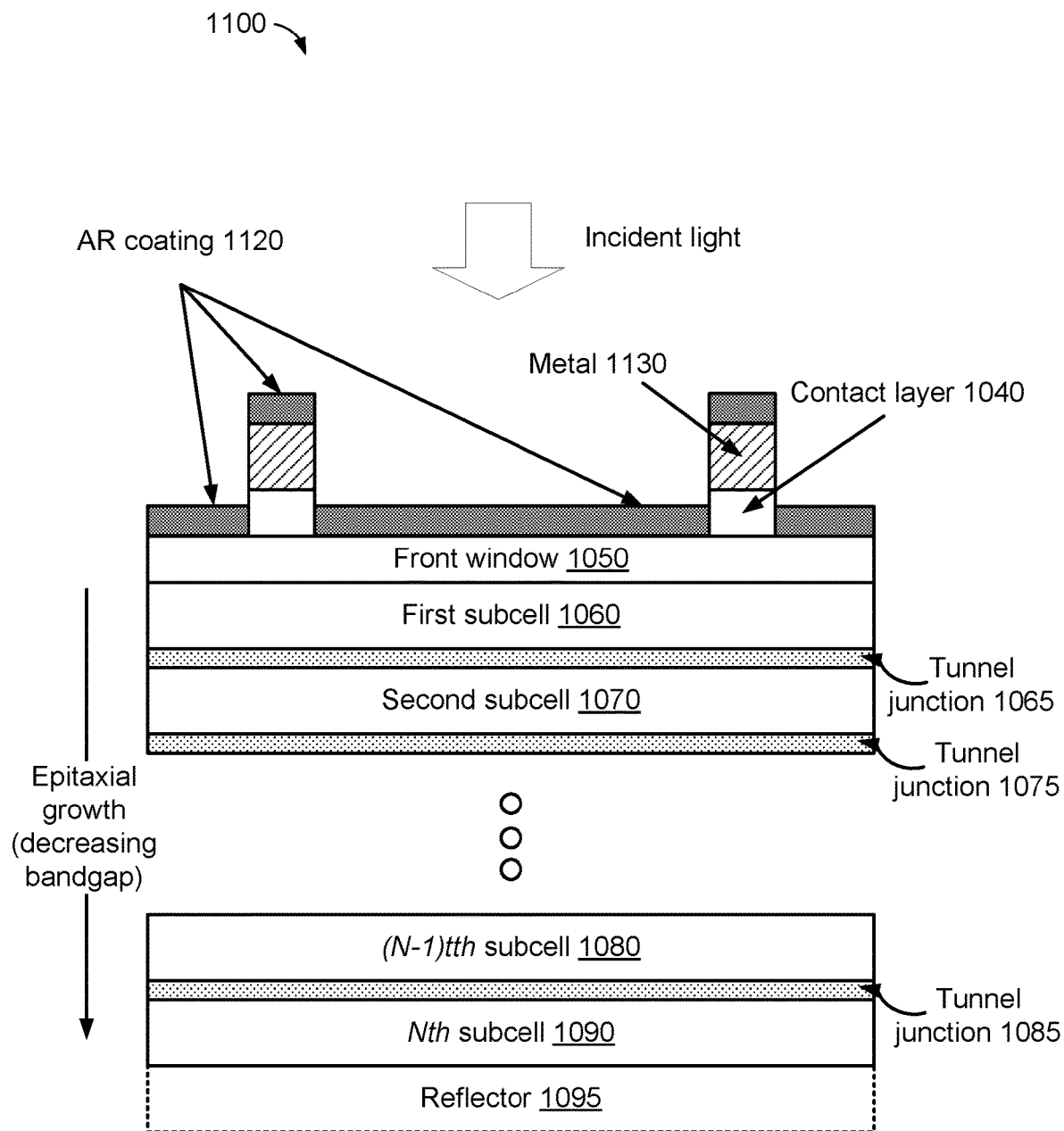

FIG. 11 shows a diagram 1100 that illustrates the multi-junction optoelectronic device in FIGS. 10A and 10B after being separated from the growth structure (or the engineered growth structure). In the diagram 1100, the multi-junction optoelectronic device is shown sunny side up with the reflector 1095 added on the back side and metal 1130 and an anti-reflecting (AR) coating 1120 added to the front side.

The reflector 1095, which can also be referred to as reflective back contact, is a metallic reflector or a metal-dielectric reflector. These reflective back contact can be deposited either before or after the multi-junction optoelectronic device is lifted off and can comprise one or more of silver, aluminum, gold, platinum, copper, nickel, molybdenum or alloys thereof. The layer with the reflective back contact can be deposited by a vapor deposition process, such as physical vapor deposition (PVD), sputtering, electron beam deposition (e-beam), ALD, CVD, PE-ALD, or PE-CVD, or by other deposition processes including inkjet printing, screen printing, evaporation, electroplating, electroless deposition (e-less), or combinations thereof.

Figure 12:
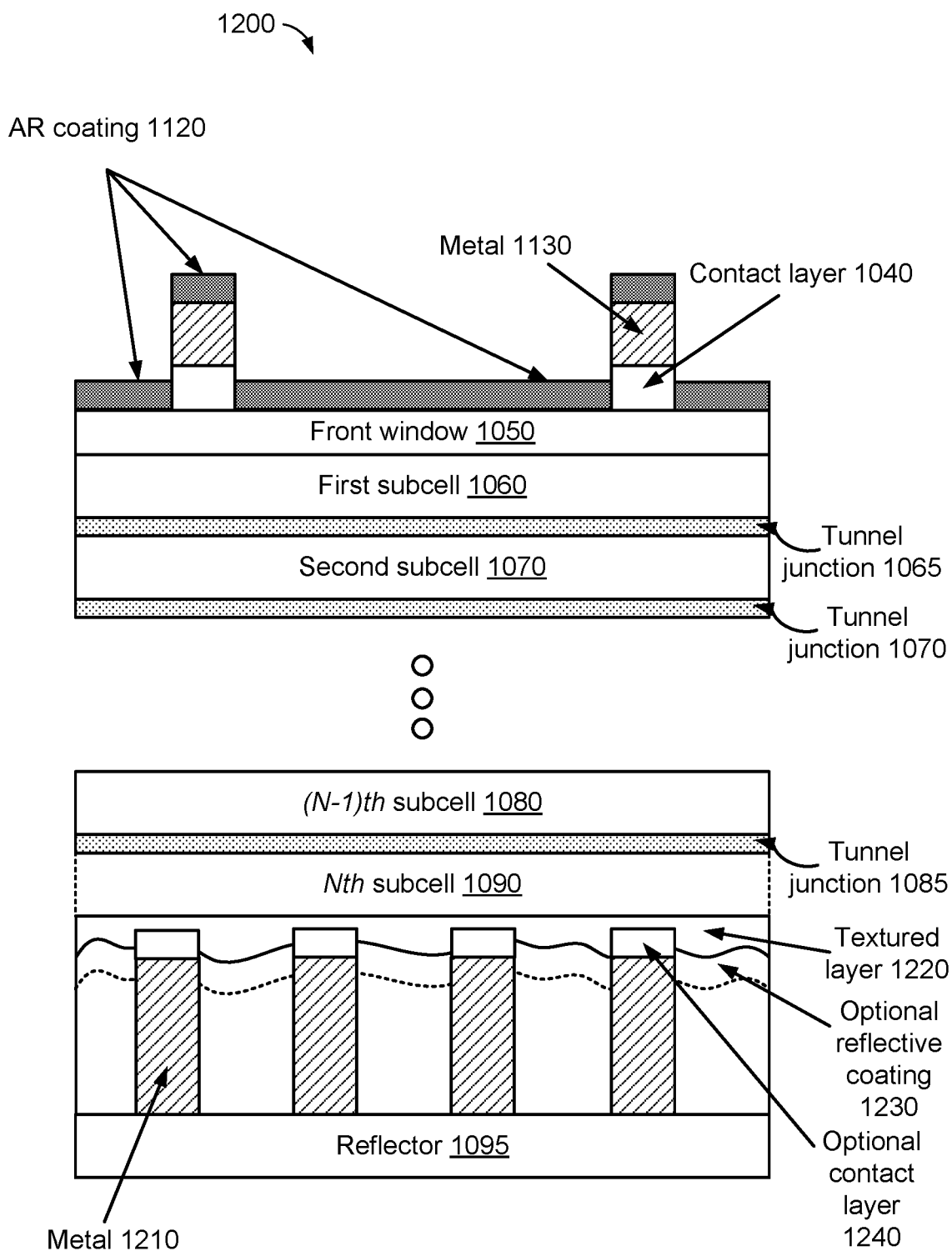

FIG. 12 shows a diagram 1200 that illustrates the multi-junction optoelectronic device in FIG. 11 including the reflector 1095 added on the back side and the metal 1130 and the AR coating 1120 added to the front side. In addition, between the reflector 1095 and the Nth subcell 1090, there is a textured layer 1220, an optional reflective coating 1230 adjacent to the textured layer 1220, one or more metals 1210 in contact with the reflector 1095, and optionally a contact layer 1240 at the end of the one or more metals 1210. Surface texturing, as provided by the textured layer 1220 and/or the adjacent optional reflective coating 1230, can improve the scattering of light at that surface, as well as improve adhesion to both metal and dielectric layers.

Texturing associated with the multi-junction optoelectronic device need not be limited to the textured layer 1220 and/or the optional adjacent reflective coating 1230. The texturing of a surface can be achieved during the growth of the materials that comprise a subcell. This can be achieved at least in part by using a lattice mismatch between at least two materials in the subcell, for example in a Stranski-Krastanov process or a Volmer-Weber process, to produce texturing at the interface between the materials. In another implementation, a layer in or on the subcell can act as an etch mask and texturing can be provided by an etching process. In yet another implementation, texturing can be provided by physical abrasion such as sandpaper or sandblasting or particle blasting or similar processes. In yet another implementation, texturing can be provided by an inhomogeneous wet or dry etching process that produces microscopically non-uniform features on a surface. Moreover, texturing can be accomplished using techniques similar to those used in silicon texturing, including, for example, "random pyramid" or "inverted pyramid" etching using, for example, KOH.

The back side (as in this example) and/or the front side (e.g., the side closest to where light is incident on a photovoltaic cell or emitted by an LED) of a subcell can be textured to improve light scattering into and/or out of the device. In back-side texturing as shown in FIG. 12, the materials of the subcells can be textured using one or more of the texturing techniques described above.

Figure 13A:
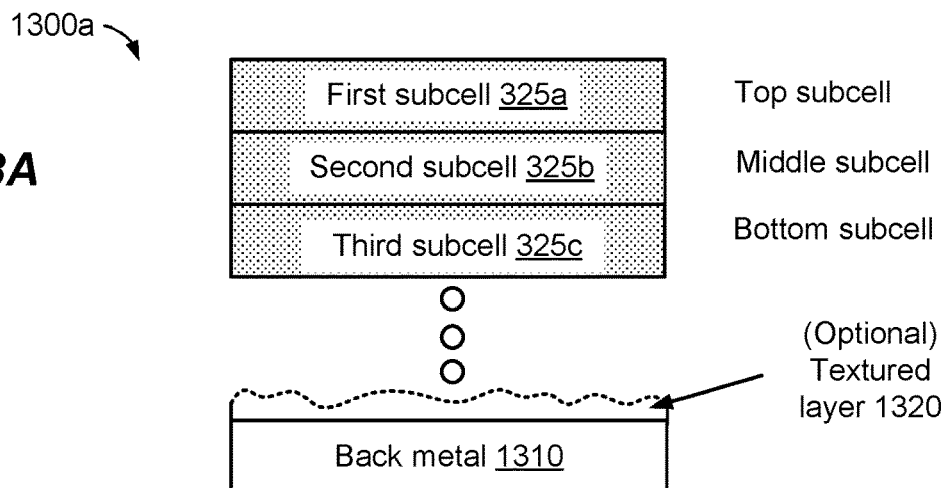
FIGS. 13A-13C illustrate multiple diagrams of optoelectronic devices with a reflector or back metal layer in accordance with aspects of this disclosure.

FIG. 13A shows a diagram 1300a illustrating an optoelectronic device with an epitaxial layer like the one described in the diagram 300e in FIG. 3E. The optoelectronic device may include additional layers, such as a back metal layer 1310 that may be used as a reflector, for example. The optoelectronic device may include additional layers between the third subcell 325c (e.g., the bottom subcell) and the back metal 1310, such as a textured layer 1320, for example.

Figure 13B:
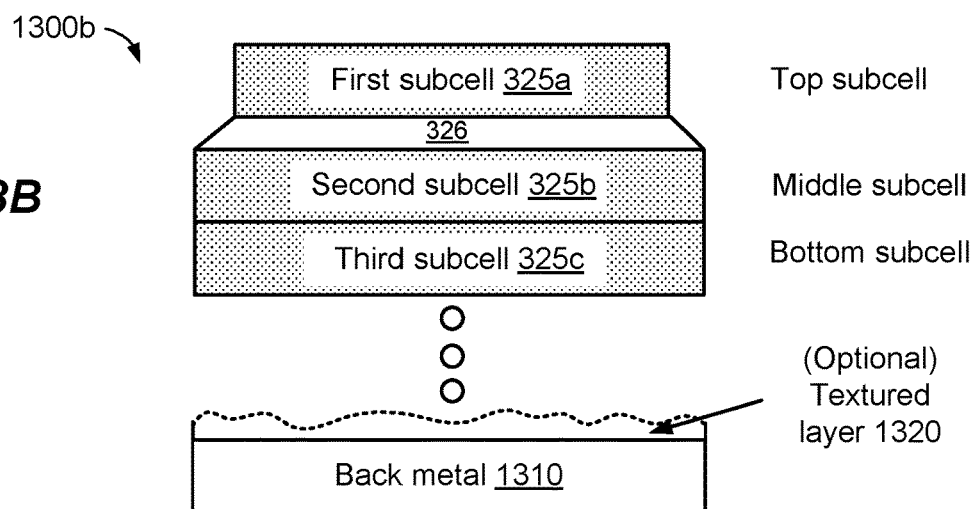

Shown in FIG. 13B is a diagram 1300b illustrating an optoelectronic device with an epitaxial layer like the one described in the diagram 300f in FIG. 3F. The optoelectronic device may include additional layers, such as the back metal layer 1310. The optoelectronic device may include additional layers between the third subcell 325c and the back metal 1310, such as the textured layer 1320, for example.

Figure 13C:
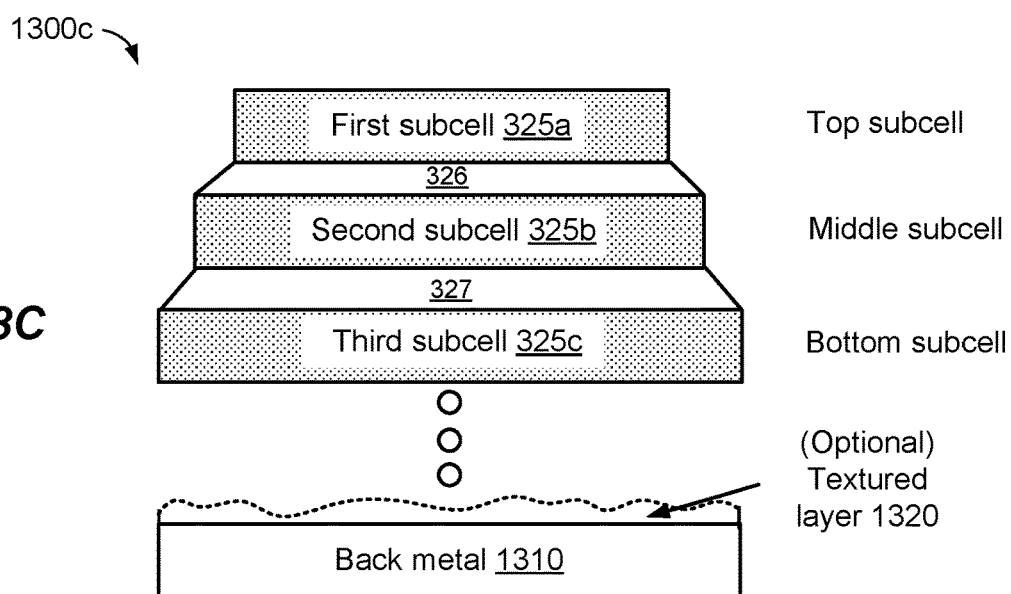

Shown in FIG. 13C is a diagram 1300c illustrating an optoelectronic device with an epitaxial layer like the one described in the diagram 300g in FIG. 3G. The optoelectronic device may include additional layers, such as the back metal layer 1310. The optoelectronic device may include additional layers between the third subcell 325c and the back metal 1310, such as the textured layer 1320, for example.

The optoelectronic devices shown in FIGS. 13A-13C may include some or all of the features described in connection with the multi-junction optoelectronic devices in FIGS. 11 and 12.

It is to be understood that any of the one or more subcells of an epitaxial layer in an optoelectronic device can be made using one or more of the following processes: a metalorganic chemical vapor deposition (MOCVD) process, a hydride vapor phase epitaxy (HVPE) process, a molecular beam epitaxy (MBE) process, a metalorganic vapor phase epitaxy (MOVPE or OMVPE) process, a liquid phase epitaxy (LPE) process, a close-space vapor transport (CSVT) epitaxy process, a plasma enhanced chemical vapor deposition (PECVD) process, a physical vapor deposition (PVD) process, an atmospheric pressure chemical vapor deposition (APCVD) process, an atomic layer deposition (ALD) process, a low pressure chemical vapor deposition (LPCVD) process, a hot-wire chemical vapor deposition (HWCVD) process, an inductively coupled plasma enhanced chemical vapor deposition (ICP-CVD) process, or other forms of CVD.

While the terms "growth structure" and "engineered growth structure" have been used in this disclosure to respectively refer to a structure that includes a substrate or wafer and a lattice transition or lattice transition layer and a structure that includes a substrate that is made by a layer transfer process or from a ternary material and/or quaternary material, it is to be understood that an "engineered growth structure" can also refer to structure with a substrate that includes a lattice transition or lattice transition layer. That is, an "engineered growth structure" can be made by a layer transfer process or from a ternary material and/or quaternary material and include a lattice transition or lattice transition layer While the terms "epitaxial layer" and "epitaxial stack" have been used interchangeably in this disclosure, it is to be understood that the term "epitaxial layer" may refer to a single epitaxially-grown layer or to multiple epitaxially-grown layers, and that the term "epitaxial stack" may generally refer to a stack of multiple epitaxially-grown layers.

The terms "substrate" and "wafer" have been used interchangeably in this disclosure, while the terms "growth structure" and "engineered growth structure" may refer to structures that include a substrate or wafer and that may include additional layers over the substrate or wafer.

Although some of the examples described herein refer to a semiconductor structure, it is to be understood that such structures can include other materials. For example, some structures are referred to as semiconductor structures because of the use of a semiconductor wafer or substrate; however, a semiconductor structure may use instead an insulator or oxide as a wafer or substrate, while other layers of the semiconductor structure are made of a semiconductor material. Accordingly, the terms "semiconductor structure" and "structure" may be used interchangeably to refer to a structure in which at least one of the layers is a semiconductor layer, whether that layer is a wafer or substrate or some other layer.

It is also to be understood that while the disclosure refers to the "optoelectronic device" as being part of an epitaxial layer or stack, the "optoelectronic device" refers to the functional portion or segment of an operational device (e.g., solar cell, LED) that is constructed by the epitaxial layer or stack. As such, the operational device includes, at least in part, the optoelectronic device.

Although the present disclosure has been provided in accordance with the implementations shown, one of ordinary skill in the art will readily recognize that there could be variations to the embodiments and those variations would be within the scope of the present disclosure. For example, different materials, structures, subcells, and/or optoelectronic devices can be contemplated that are consistent with the techniques described in this disclosure. Accordingly, many modifications may be made by one of ordinary skill in the art without departing from the scope of the appended claims.

What is claimed is:

1. A method of manufacturing an optoelectronic device, the method comprising:
   providing a growth structure having a substrate with a lattice transition from a first lattice constant to a second lattice constant having a relaxed lattice constant or an engineered growth structure with lattice constant different than typical conventional single or binary element substrates;
   depositing an epitaxial layer over the growth structure or on the engineered growth structure, the epitaxial layer including one or more subcells that form the optoelectronic device, each subcell including at least one pn junction, and the subcells being lattice matched to the second lattice constant of the growth structure; and
   separating the epitaxial layer with the optoelectronic device from the growth structure or the engineered growth structure,
   wherein the conventional single or binary element substrates include Ge, Si, InP, and GaAs substrates.

2. The method of claim 1, wherein:
   the second lattice constant ranges from a lattice constant of GaAs (5.65 Å) to a lattice constant of InP (5.87 Å), or
   the second lattice constant ranges from a lattice constant of GaP (5.45 Å) to a lattice constant of GaAs (5.65 Å).

3. The method of claim 1, wherein being lattice matched includes bulk epitaxial layers with thickness greater than 300 nanometers and with a lattice mismatch that is less than 500 arc-seconds.

4. The method of claim 1, wherein the growth structure includes a buffer layer disposed over a graded layer, the method further comprising depositing a release layer over the buffer layer, and separating the epitaxial layer from the growth structure includes removing the release layer.

5. The method of claim 4, wherein the buffer layer includes an overshoot layer to provide the relaxed lattice constant before depositing the epitaxial layer, the overshoot layer having a greater lattice constant than layers underneath and above the overshoot layer.

6. The method of claim 1, further comprising depositing a release layer over the growth structure, the epitaxial layer being deposited over the release layer.

7. The method of claim 6, wherein:
   the release layer includes an aluminum-containing compound, the aluminum-containing compound is one of AlAs, AlGaAs, (Al)InGaAs, AlInP, AlInGaP, or AlInAs, and wherein the aluminum-containing compound is susceptible to etching by hydrofluoric acid (HF), or
   the release layer includes graphene.

8. The method of claim 6, wherein separating the epitaxial layer from the growth structure or the engineered growth structure includes removing the release layer by one of an epitaxial lift-off (ELO) process, a laser lift-off process, spalling, or a combination thereof.

9. The method of claim 1, wherein:
   the optoelectronic device is a single-junction photovoltaic device, and
   the one or more subcells include a single subcell.

10. The method of claim 1, wherein the first lattice constant is about 5.655+/−0.005 Å or 5.65+/−0.01 Å, and the second lattice constant is in the range of 5.661 Å to 5.89 Å, the second lattice constant being based on the number of junctions in the optoelectronic device.

11. The method of claim 1, further comprising depositing an etch stop layer over the growth structure, the epitaxial layer being deposited over the etch stop layer.

12. The method of claim 11, wherein the etch stop layer is selected such that it can be selectively wet-etched from its adjacent layers.

13. The method of claim 11, wherein:
   the etch stop layer is made of InGaP, and
   the etch stop layer is made of at least one layer.

14. The method of claim 11, wherein separating the epitaxial layer from the growth structure includes removing at least a portion of the growth structure through one or more of etching, polishing, grinding, or spalling, or graphene as the release layer, such removal being limited from encroaching the epitaxial layer by the etch stop layer.

15. The method of claim 1, wherein the substrate of the growth structure includes a Group III-V semiconductor material.

16. The method of claim 15, wherein the Group III-V semiconductor material is GaAs.

17. The method of claim 1, wherein:
   the growth structure includes a graded layer that provides the transition from the first lattice constant to the second lattice constant, and wherein the graded layer is a compositionally graded buffer,
   the compositionally graded buffer includes InGaAs, AlInGaAs, InGaP, or GaAsP or SiGe, and
   the transition from the first lattice constant to the second lattice constant in the compositionally graded buffer is achieved by respectively changing the stoichiometry of the InGaAs, the AlInGaAs, the InGaP, the GaAsP, or the SiGe.

18. The method of claim 1, wherein the optoelectronic device is a metamorphic device having a first subcell of the one or more subcells lattice matched to the growth structure underneath and subsequent subcells of the one or more subcells are lattice mismatched internally to each other and to the growth structure.

19. The method of claim 1, wherein the growth structure is an engineered growth structure made from a layer transfer process between two wafers of disparate materials or from a ternary material and/or a quaternary material.

20. The method of claim 1, wherein any of the one or more subcells of the epitaxial layer is made using one or more of the following processes:
   a metalorganic chemical vapor deposition (MOCVD) process,
   a hydride vapor phase epitaxy (HVPE) process,
   a molecular beam epitaxy (MBE) process,
   a metalorganic vapor phase epitaxy (MOVPE or OMVPE) process,
   a liquid phase epitaxy (LPE) process,
   a close-space vapor transport (CSVT) epitaxy process,
   a plasma enhanced chemical vapor deposition (PECVD) process,
   a physical vapor deposition (PVD) process,
   an atmospheric pressure chemical vapor deposition (APCVD) process,
   an atomic layer deposition (ALD) process,
   a low pressure chemical vapor deposition (LPCVD) process,
   a hot-wire chemical vapor deposition (HWCVD) process,
   an inductively coupled plasma enhanced chemical vapor deposition (ICP-CVD) process, or
   other forms of CVD.

21. A method of manufacturing an optoelectronic device, the method comprising:
   providing an engineered growth structure having a substrate and a relaxed lattice constant, the engineered growth structure being made from a layer transfer process between two wafers of disparate materials or from a ternary material and/or a quaternary material that produces the relaxed lattice constant;

depositing a release layer or an etch stop layer on the engineered growth structure;

depositing an epitaxial layer on the release layer or the etch stop layer, the epitaxial layer including one or more subcells that form the optoelectronic device, each subcell including at least one pn junction, and the subcells being lattice matched to the relaxed lattice constant of the engineered growth structure; and if the release layer is deposited, removing the release layer to separate the epitaxial layer with the optoelectronic device from the engineered growth structure, or if the etch stop is deposited, grinding or etching away the engineered growth structure to separate the epitaxial layer with the optoelectronic device from the engineered growth structure.

22. The method of claim 21, wherein:

the ternary material is made of a combination of three elements from In, Ga, Al, As, P, N, B, Bi, and Sb, and the quaternary material is made of a combination of four elements from In, Ga, Al, As, P, N, B, Bi, and Sb.

23. The method of claim 21, wherein:

the relaxed lattice constant of the engineered growth structure ranges from a lattice constant of GaAs (5.65 Å) to a lattice constant of InP (5.87 Å), the relaxed lattice constant of the engineered growth structure is greater than a lattice constant of GaP (5.45 Å), or the relaxed lattice constant of the engineered growth structure ranges from a lattice constant of GaP (5.45 Å) to a lattice constant of GaAs (5.65 Å).

24. The method of claim 21, wherein the substrate of the engineered growth structure is made of InGaAs, AlInGaAs, InGaP, or GaAsP or GaAsSb or GaAsBi.

25. The method of claim 21, wherein:

the one or more subcells includes a first subcell, a second subcell, and a third subcell, all of which are internally matched within the epitaxial layer, the first subcell is made of GaInP or AlGaInP, the second subcell is made of GaAsP or AlGaAsP, the third subcell is made of SiGe or SiGeSn, the substrate of the engineered growth structure is a ternary substrate made of GaAsP or GaInP and having a lattice constant ranging between the lattice constant of GaP and the lattice constant of GaAs.

* * * * *